(12) United States Patent
Ellenbogen

(10) Patent No.: US 6,339,227 B1
(45) Date of Patent: Jan. 15, 2002

(54) MONOMOLECULAR ELECTRONIC DEVICE

(75) Inventor: James C. Ellenbogen, McLean, VA (US)

(73) Assignee: The Mitre Corporation, McLean, VA (US)

( * ) Notice: Subject to any disclaimer, the term of this patent is extended or adjusted under 35 U.S.C. 154(b) by 0 days.

(21) Appl. No.: 09/240,892

(22) Filed: Feb. 1, 1999

(51) Int. Cl.[7] .................. H01L 29/06; H01L 31/072; H01L 31/109; H01L 35/24; H01L 51/00
(52) U.S. Cl. .................. 257/40; 257/23; 257/24
(58) Field of Search .................. 257/17, 20, 23, 257/24, 40

(56) References Cited

U.S. PATENT DOCUMENTS

| | | | |
|---|---|---|---|
| 3,953,874 A | 4/1976 | Aviram et al. .................. | 257/40 |
| 4,945,257 A | 7/1990 | Marrocco, III .................. | 307/210 |
| 5,347,144 A | 9/1994 | Garnier et al. .................. | 257/40 |
| 5,475,341 A | 12/1995 | Reed .................. | 327/566 |
| 5,589,692 A | * 12/1996 | Reed .................. | 257/23 |
| 5,646,420 A | 7/1997 | Yamashita .................. | 257/17 |
| 5,681,442 A | 10/1997 | Ogawa et al. .................. | 205/122 |
| 5,753,523 A | 5/1998 | Giedd et al. .................. | 438/610 |
| 5,773,966 A | 6/1998 | Takao .................. | 326/135 |

FOREIGN PATENT DOCUMENTS

| | | |
|---|---|---|
| FR | 2306531 | 10/1976 |
| JP | 3-256361 | 11/1991 |
| JP | 7-106549 | 4/1995 |
| WO | 97/36333 | 10/1997 |

OTHER PUBLICATIONS

Davie Goldhaber–Gordon et al., Overview of Nanoelectronic Devices, Proceedings of the IEEE, vol. 85, No. 4, Apr. 1997.*

* cited by examiner

Primary Examiner—Allan R. Wilson
(74) Attorney, Agent, or Firm—Rosenberg, Klein & Lee

(57) ABSTRACT

A monomolecular electronic device is provided that includes a molecular diode having at least one barrier insulating group chemically bonded between a pair of molecular ring structures to form a pair of diode sections, at least one dopant group chemically bonded to one of the pair of diode sections, and a molecular gate structure chemically bonded to the one diode section for influencing an intrinsic bias formed by the at least one dopant group. The device thus produced operates as a molecular electronic transistor, exhibiting both switching and power gain. By adding yet another insulating group to the other of the diode sections, an electrical resistance is formed to define an output which represents an inverter or NOT gate function. The NOT gate can be chemically bonded to molecular diode-diode logic structures to form a single molecule that exhibits complex Boolean functions and power gain.

36 Claims, 18 Drawing Sheets

MONOMOLECULAR ELECTRONIC DEVICE

BACKGROUND OF THE INVENTION

1. Field of the Invention

The present invention is directed to a monomolecular electronic device. In particular, the present invention is directed to a monomolecular transistor and monomolecular digital logic structures utilizing a molecular transistor to provide switching and power gain. More particularly, the present invention directs itself to the adding of a molecular gate structure to a molecular diode, where the diode is also chemically doped. The molecular gate structure is formed by yet another insulator group bonded to the molecular diode in proximity to a respective dopant group that is influenced by a potential applied externally to the gate structure. A current conducting complex is bonded to this second insulating group so that it can be charged by an external voltage to influence the intrinsic bias of the diode and thereby switch the device "on" and "off". Still further, this invention is directed to a molecular transistor wherein the power required to control the switching is substantially less than that which is being switched, and therefore the transistor exhibits power gain. The present invention also pertains to monomolecular logic gates constructed from combinations of monomolecular diode-diode logic and monomolecular inverters having power gain.

2. Prior Art

For the past forty years, electronic computers have grown more powerful as their basic sub-unit, the transistor, has shrunk. However, the laws of quantum mechanics and the limitations of fabrication techniques soon may prevent further reduction in the size of today's conventional field-effect transistors. Many researchers project that during the next ten to fifteen years, as the smallest features on mass-produced transistors shrink further from their present approximate width in the range of 100 nanometers to 250 nanometers, the devices will become more difficult and costly to fabricate. In addition, they may no longer function effectively in ultra-densely integrated electronic circuits. In order to continue the miniaturization of circuit elements down to the nanometer scale or even to the molecular scale, researchers have been investigating several alternatives to the solid-state transistor for ultra-dense circuitry. However, unlike today's FETs, which operate based on the movement of masses of electrons in bulk matter, the new devices take advantage of quantum mechanical phenomena that emerges at the nanometer scale.

There are two broad classes of nanoelectronic switches and amplifiers.

(a) solid-state quantum-effect and single electron devices, and (b) molecular electronic devices.

Devices in both classes take advantage of the various quantum effects that begin to dominate electron dynamics on the nanometer scale. Despite the novelty of the designs of solid-state quantum-effect and single electron devices, researchers already have been able to develop, fabricate, and employ in circuitry several promising new device types by building upon fifty years of industrial experience with bulk semiconductors. Such solid-state quantum-effect devices change the operating principles for ultra-miniature electronic switches, but they still bear the difficult burden of relying on nanometer-scale structures that must be "carved" out of amorphous or crystalline solids.

Molecular electronics is a relatively new approach that would change both the operating principles and the materials used in electronic devices. The incentive for such radical change is that molecules are naturally occurring nanometer-scale structures. Unlike nanostructures built from bulk solids, molecules can be made identically, cheaply, and easily, as will be needed for industrial scale production of ultra-dense computers. Two of the significant challenges to overcome are (1) to devise molecular structures that act as electronic switches having gain, and (2) to combine those molecules into a more complex circuit structure needed for computation and control applications, as well as providing gain in those applications, so that the devices thus produced have a usable "fan out".

As is known, a diode is a two-terminal switch, which can turn a current "on" or "off". Two types of molecular-scale electronic diodes that have been developed recently, are:

(a) rectifying diodes, and (b) resonant tunneling diodes.

Both types of diodes rely on the application of an external bias voltage to drive electrons through one or more energy barriers when the externally applied potential reaches a predetermined magnitude.

A molecular resonant tunneling diode (RTD) has been developed, which takes advantage of energy quantization in a manner that permits the amount of voltage bias across the source and drain contacts of the diode to switch "on" and "off" electron current traveling from the source to the drain. Depicted in FIG. 1A, is a molecular resonant tunneling diode that has been synthesized by James M. Tour and demonstrated by Mark A. Reed in 1997. Structurally and functionally, the device is a molecular analog of the much larger solid-state RTDs that for the past decade have been fabricated in quantity in III-V semiconductors. Based upon a molecular conductive wire backbone, as shown in FIG. 1A, Reed's and Tour's polyphenylene molecular RTD 11' is made by inserting two aliphatic methylene groups 16' into the molecular conducting wire 12 on either side of a single benzene ring 13'. Because of the insulating properties of the aliphatic groups 16', they act as potential energy barriers 30 and 32 to electron flow, shown in the energy diagrams of FIGS. 1B and 1C. They define the benzene ring 13' between them as a narrow, approximately 0.5 nanometer, "island" through which electrons must pass in order to traverse the length of the molecular wire.

As illustrated in FIG. 1B, if the bias across the molecule produces incoming electrons with a kinetic energy, that differs from the energies of unoccupied quantum levels available inside the potential well on the island, the current does not flow. The RTD is switched "off". However, if the bias voltage is adjusted so that the kinetic energy of the incoming electrons aligns with that of one of the internal energy levels, as shown in FIG. 1C, the energy of the electrons outside the well is said to be in resonance with the allowed energy inside the well. Under that condition, current flows through the device and that is said to be switched "on".

In French Patent Publication #2306531 there is disclosed a molecular switching device that may be used for amplification. Conductors are formed by chains of adjacent double links or bonds between the rings thereof, and are terminated in two dissipating regions. However, the referenced device has a principal of operation that is generally analogous to bulk effect semiconductors, rather than an effect that can only be realized in individual molecules, wherein, for example, the effects of at least one dopant are reversed by an externally applied potential.

In PCT Publication #WO97/36333 there is disclosed a tunneling device which makes use of control electrodes to control the tunneling current flowing between the input and output of the device. The device is based on the principle of controllable correlated electron tunneling. The reference also suggests the use of such a device to construct single-electron logical circuits.

SUMMARY OF THE INVENTION

A monomolecular electronic device is provided that includes a plurality of molecular conducting wires chemically joined together with at least one insulating group. At least one of the plurality of molecular conducting wires is chemically joined to a dopant substituent to form an intrinsic bias across the insulating group. A second insulating group is chemically coupled to the molecular conducting wire that is joined to the dopant substituent. A current conducting complex is chemically joined to the second insulating group to form a single molecule that exhibits power gain. The second insulating group is disposed in sufficient proximity to the dopant substituent to influence the intrinsic bias with a potential applied to the current conducting complex. The monomolecular electronic device of the present invention may be provided in the form of an inverter circuit wherein a third insulating group is chemically bonded to a second of the plurality of conducting wires, and a plurality of joined aromatic ring structures are chemically bonded to the third insulating group.

Looking at the invention from another aspect, such is directed to a monomolecular electronic device having power gain. The monomolecular electronic device includes at least one molecular conducting wire having a plurality of joined substantially identical aromatic ring structures. At least one first insulating group bonded between a respective pair of the aromatic ring structures establishes two sections of the molecular conducting wire, a first of the sections being coupled to a first electrical contact, and a second of the sections being coupled to a second contact. At least one of the two sections is doped to form at least one of an electron donor site and an electron acceptor site. A molecular gate structure is chemically bonded to one of the first and second sections in sufficient proximity to the dopant to influence by means of a potential applied to the gate structure an intrinsic bias formed between the first and second sections by the dopant. The molecular gate structure is coupled to a third contact for coupling to a source of the applied potential.

From yet another aspect, the present invention is directed to a monomolecular transistor that includes a polyphenylene-based conducting wire having a plurality of joined molecular ring structures, and at least one insulating group bonded between a respective pair of the molecular ring structures to establish two sections of the conducting wire. The monomolecular transistor also includes a first dopant group bonded to at least one molecular ring structure of one section of the conducting wire to form a respective electron donor site. A second dopant group bonded to at least one molecular ring structure of the other section forms an electron acceptor site. A second insulating group is chemically bonded in proximity to one of the first and second dopant groups, and a current conducting complex is bonded to the second insulating group for coupling an electric charge thereto for modifying an intrinsic bias formed by the first and second dopant groups.

From a further aspect, the present invention is directed to a monomolecular electronic device formed by a molecular diode having at least one barrier insulating group chemically bonded between a pair of molecular ring structures to form a pair of diode sections. At least one dopant group is chemically bonded to one of the pair of diode sections. A molecular gate structure is chemically bonded to the one diode section to which at least one dopant group is chemically bonded for influencing an intrinsic bias formed by the at least one dopant group.

It is therefore an object of the present invention to provide a monomolecular switching device that exhibits power gain.

It is a further object of the present invention to provide an electronic switching device with power gain by the addition of a gate structure to a doped molecular diode to form a single molecule which functions as a transistor.

It is still another object of the present invention to provide a monomolecular transistor circuit that functions as an inverter.

Further, it is an object of the present invention to provide Boolean logic functions by the joining together of molecular diode-diode logic structures with a molecular inverter to provide particular Boolean functions and simultaneously thereby provide power gain.

These and other advantages and novel features of the invention will become apparent from the following detailed description when considered in connection with the accompanying drawings.

DESCRIPTION OF THE PREFERRED EMBODIMENTS

Figure 2A:
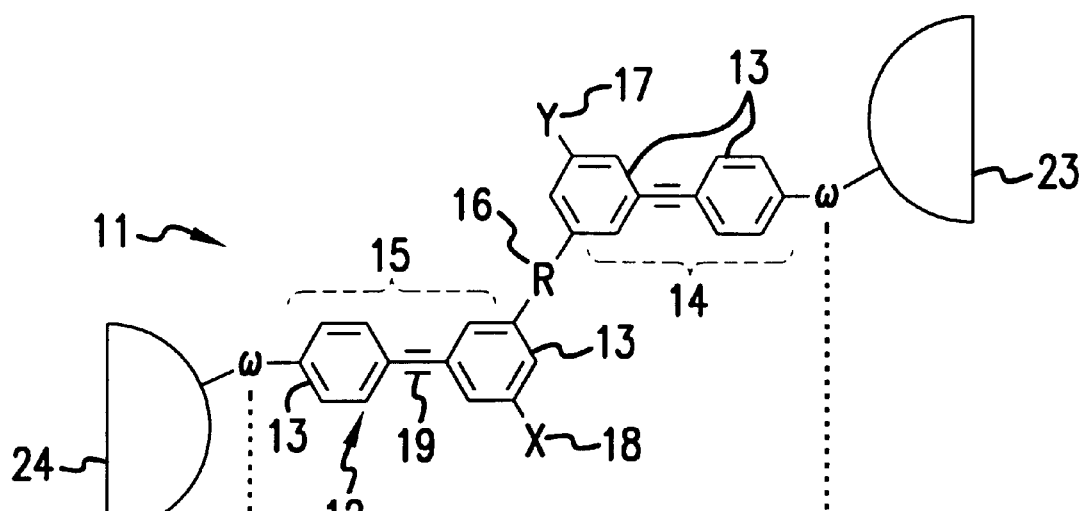
FIG. 2A shows an exemplary schematic representation of a molecular rectifying diode.

Referring to FIG. 2A, there is shown a rectifying diode molecular structure 11 which is based on a polyaromatic conducting wire 12 which comprises a plurality of sequentially bonded substantially identical aromatic ring structures 13. As applied herein, molecular conducting wire is a single molecule having a plurality of substantially identical ring structures bonded or linked together, sequentially and/or in parallel, that form an electrically conductive molecular chain or mesh. By "linked" aromatic rings, it is meant that the rings are singly or multiply bonded to each other or to intervening carbon atoms or hydrocarbon groups. The use of the term aromatic ring is meant to include ring molecular structures having substantially aromatic character, such as rings into which heteroatoms have been inserted and bonded in the ring. Such heteroatoms being atoms other than carbon, for example, atoms selected from elements in groups III, IV and V of the Periodic Table, like boron, silicon, or nitrogen. The conductive molecular wire may be formed of such rings as benzene, cyclopentadiene, cyclopropene, and combinations thereof.

The single molecule 11 has two sections 14 and 15 separated by an insulating group 16, represented by an R. The section 14 of the molecule 11 may be doped by at least one electron withdrawing group, represented by a Y, bonded thereto. The section 15 of the molecule 11 may be doped by at least one electron donating group 18, represented by an X, bonded thereto. In fact, only one section 14 or 15 need be doped. The aromatic rings are linked together with at least one of the respective X and Y group dopants being bonded to one or more sites of the respective sections of the conducting wire. The bonding of the insulator and dopants to the conducting wire may be carried out by conventional insertion and substitution reactions well known in the art, either alone or in combination with manipulation techniques using a scanning tunneling electron microscope or other nanoprobe. Further, the insulating group 16 may be utilized to "splice" two conducting wires together, each representing a respective one of the sections 14 and 15.

As shown, the molecular structure 11 represents a rectifying diode that is integrally embedded in a polyphenylene-based molecular conducting wire 12. Here, the benzene rings 13 are linked by triply bonded ethynylene linkages 19. The triply bonded ethynylene linkages 19 are inserted as spacers between the rings 13 in order to eliminate the steric interference between hydrogen atoms bonded to the adjacent rings 13. An insulator 16 is incorporated into the conducting wire by bonding a saturated aliphatic group, or a group having a predominant aliphatic character with respect to electron transport (no pi-orbitals) therein. The addition of the insulator 16 divides the conducting wire into two sections 14 and 15. The section 14 is shown to be doped to form an electron acceptor site, and the section 15 is doped to form an electron donor site. Although only one electron donor site and one electron acceptor site are shown, multiple sites may be incorporated into the structure, into the same ring, or adjacent rings, to adjust the voltage drop across the insulator 16. It should also be noted, that a sufficient voltage drop can be obtained by doping a single section 14, or 15 with a respective dopant 17, or 18. The respective distal ends of the conducting wires are joined to contacts. The conductivity of that connection is improved by the subtituent group ω respectively at the distal ends of the conducting wire and chemically binds to an electrical contact.

Figure 2B:
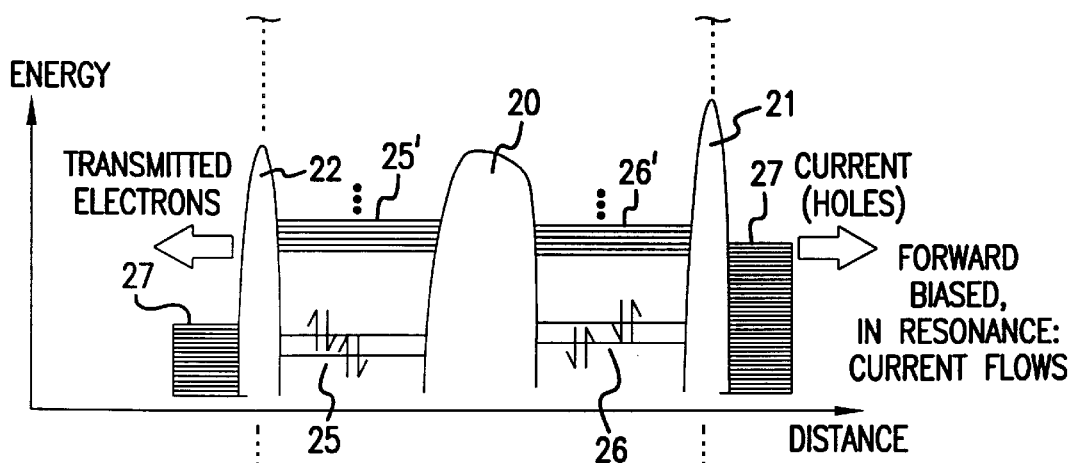
FIGS. 2B, 2C and 2D show schematically the orbital energy diagram associated with a polyphenylene-based monomolecular rectifying diode structure, shown in FIG. 2A, when the molecule has an applied "forward" bias, and applied "reverse" bias, and a "zero" bias, respectively.
Figure 2C:
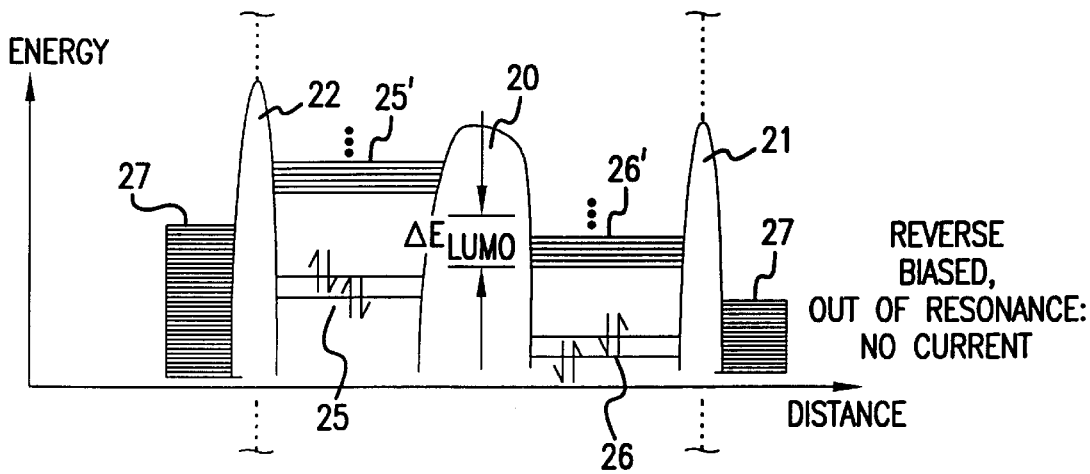
Figure 2D:
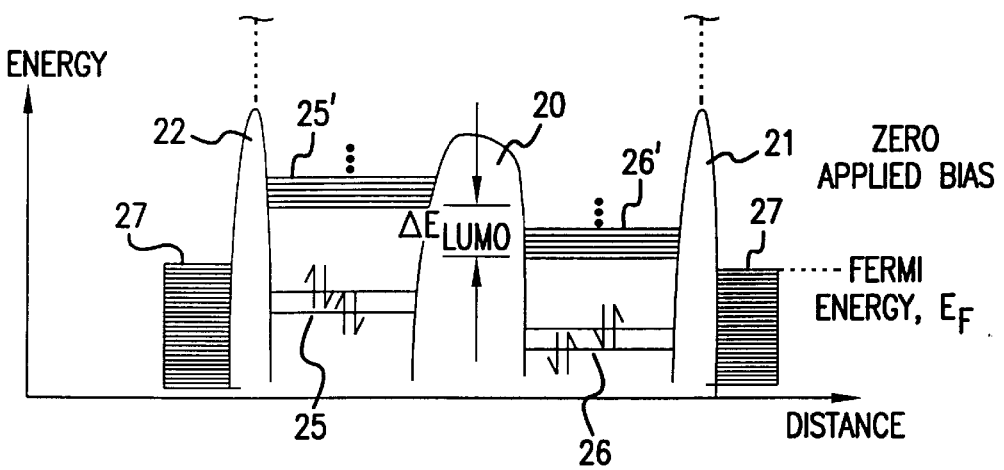

Comparing the molecular structure 11 shown in FIG. 2A with the potential energy diagrams shown in FIGS. 2B–2D, it may be observed that the insulating group 16 in substantially the middle of the molecule 11 is associated with a potential energy barrier 20. There are also barriers 21 and 22 between the molecule 11 and the conductive contacts 23 and 24 at either end of the molecule 11 formed by substituents ω having a characteristic for selective attachment in the particular atomic or molecular structure of the contacts 23, 24. The barrier 20 serves to maintain a degree of electrical isolation between the different parts of the structure, sufficient to prevent the energy levels 26, 26' and 25, 25' of the sections 14 and 15 from coming into equilibrium. However, none of these barriers are so wide or so high as to completely prevent electrons under a bias voltage from tunneling through them. The material of the contacts 23, 24 may be a metal or a conductive non-metal, such as buckytubes. The insulating group R could be any group that is more insulating than the polyaromatic chain 12. Some candidates for this role include aliphatic groups such as sigma bonded methylene groups ($-CH_2-$) or dimethylene groups ($-CH_2CH_2-$).

As shown in FIG. 2D, to the left of the central barrier 20, all of the pi-type valence energy levels 25 are elevated in energy because of the presence of the electron donating group 18, designated by the X in the diagram of the molecule 11. This includes both the highest occupied molecular orbital (HOMO) and the lowest occupied molecular orbital (LUMO). Among the possible electron donating substituents, the following are examples of some of the suitable substituents which may be utilized to form the rectifying diode, such substituents include: $-NH_2$, $-OH$, $-CH_3$, $-CH_2CH_3$, and the like.

In the context of modern molecular quantum mechanics, it should be understood that an electron donating group bonded to an aromatic ring tends to place a greater electron density upon the ring or where multiple X groups are bonded to several conjugated aromatic rings a greater electron density upon multiple rings, under a zero applied bias. This increases the amount of mutual repulsion among the electrons in the molecular orbital associated with the ring structure, or conjugated ring structure. In this case of the conjugated ring structure, to the left of the central barrier 20, this additional repulsive interaction raises the total energy, as well as its component orbital energies.

To the right of the central barrier all the pi-type valence energy levels are lowered in energy because of the presence of the electron withdrawing group 17, designated by a Y in the molecular diagram. This includes both the HOMOs and the LUMOs on the acceptor site. Examples of some of the electron withdrawing substituents that are suitable for forming an acceptor dopant include: —$NO_2$, —CN, —CHO, —COR', and the like, where R' is an aliphatic chain. The electron withdrawing group 17 is bonded to a ring 13 or multiple groups 17 may be respectively bonded to several conjugated aromatic rings 13. These groups tend to remove electron density from the respective ring or rings 13, thereby reducing the amount of electron repulsion among the electrons associated with the ring structure, or conjugated ring structure. These diminished repulsive interactions lower the total energy of the structure to the right of the central barrier 20, as well as its component orbital energy, under a zero bias condition.

The addition of one or more dopant substituents provides, in a sense, a "pre-bias" across the barrier 20. This pre-bias or dopant induced difference in the orbital energy levels on the two sections of the molecule 11 exists even when there is zero externally applied bias, as shown in FIG. 2D. That pre-bias must be overcome for electrons to flow from the electron acceptor doped section to the electron donor doped section, tunneling through barrier 20. The difference in energy ($\Delta E_{LUMO}$) between the orbital energy of the donor LUMO ($E_{D-LUMO}$) and the orbital energy of the lowest-energy orbital on the acceptor ($E_{A-LUMO}$), established by the doping of the conducting wire sections, make possible the rectifying diode operation of the molecule. By the use of both an electron donating group and an electron withdrawing group bonded to respective conducting wire sections, the intrinsic bias is enhanced, elevating pi-orbitals 25 of the donor section and reducing the pi-orbitals 26 of the acceptor section. As previously discussed, sufficient energy level differences can also be obtained by utilizing a single dopant, either an electron donor group or an electron acceptor group, which would be sufficient for rectifying diode operation.

The induced difference in the relative energetic positions of the valence pi-orbitals 25 in the donor section 15 and valence pi-orbitals 26 in the acceptor section 14, of the molecule 11, at zero externally applied voltage bias, provides the basis for operational principles of a monomolecular rectifying diode embedded in a molecular conducting wire. The operational principles of such a rectifying diode are described in detail in following paragraphs.

In FIG. 2B, a forward voltage bias has been placed upon the molecule 11 of FIG. 2A, with a high voltage on the contact 24 (left-hand contact) and a lower voltage on the contact 23 (right-hand contact). Under that bias condition, electrons in the occupied quantum levels of the lower voltage right-hand section 14 are induced to flow from right to left through the molecule 11 to reach the higher voltage left-hand section 15. That flow of electrons is a result of an energy differential formed by the applied bias voltage, the electrons being drawn to the section having a positive voltage applied to it.

The occupied quantum levels in each contact are represented by the closely spaced horizontal lines 27 at the far left and the far right of FIGS. 2B, 2C and 2D. The energy of the highest of these occupied levels 27, the Fermi level, is known as the Fermi energy ($E_F$) in the metal contact. Applying a forward-bias voltage tends to raise the energy of the Fermi level of the low voltage contact and lower the energy of the Fermi level in the other one.

Then, for this right-to-left flow of electrons to occur under a forward-bias, the differential voltage bias must be sufficient to raise the Fermi energy of the electrons in the occupied levels of the contact 23 at least as high as the energy of the LUMO pi-orbital in the acceptor section 14 of the molecule 11. This is in accordance with the Pauli Exclusion Principle, where more electrons are prevented from entering the lower energy HOMO pi-orbitals in the acceptor half of the molecule, since they already are doubly occupied and the electrons therein cannot tunnel off to the left.

However, if the Fermi energy of the contact 23 is raised by the forward-bias voltage, up to or above the energy of the LUMOs on the acceptor section, the electrons can tunnel from contact 23 into the empty LUMOs immediately to the left. Then, the electrons can tunnel to the left, once again, through the central insulating barrier 20 to the unoccupied manifold of molecular orbitals in the donor section 15 of the molecule 11. Above the threshold or "turn on" voltage for the molecular rectifying diode, the molecular orbitals in donor section 15 are sufficiently lowered in energy by the forward-bias voltage so that one or more of them matches a LUMO in the acceptor section 14 of the molecule 11, as depicted in FIG. 2B.

As it will be appreciated by those skilled in the art, in the forward-bias case, the amount of voltage that must be applied is not likely to be very great in order to start electrons flowing by raising the Fermi level of the contact 23 sufficiently to exceed the LUMO energy of the acceptor section 14 of the molecule 11. This is because all the energy levels of the acceptor section 14 have been lowered in advance by the presence of the substituent electron withdrawing group 17 bonded to section 14.

On the other hand, it is not so easy a matter to start electron flow when a reverse-bias voltage has been placed upon the molecule 11, as illustrated schematically in FIG. 2C. In the reverse-bias case, with the higher voltage on the contact 23 and the lower voltage on the contact 24, electrons in the right-hand contact 24 normally would not tend to flow from left to right through the molecule 11. To actually start this electron flow, through, the reverse-bias voltage must be sufficient to raise the Fermi level of the contact 24 so that it is at least as high as the energy of the LUMO pi-orbitals in the donor section 15 of the molecule 11. In the reverse-bias case, however, the amount of voltage that must be applied is considerably greater than in the forward-bias case, in order to raise the Fermi energy of the contact sufficiently to exceed the LUMO energy of the adjoining portion of the molecule 11. This is because all the energy levels of the donor section 15 have been raised in advance by the presence of the substituent donating group 18 bonded to the section 15 of the molecule 11. Such high voltage level is analogous to a reverse breakdown voltage of conventional semiconductor devices.

As shown in FIG. 2C, the same amount of voltage is applied in the reverse direction as is used in the forward direction (FIG. 2B), and such is insufficient to allow electrons to tunnel from the contact 24 into the LUMO energy level of molecule 11. The different forward and reverse-bias characteristics of molecule 11 define the classic behavior of a rectifying diode.

Figure 1A:
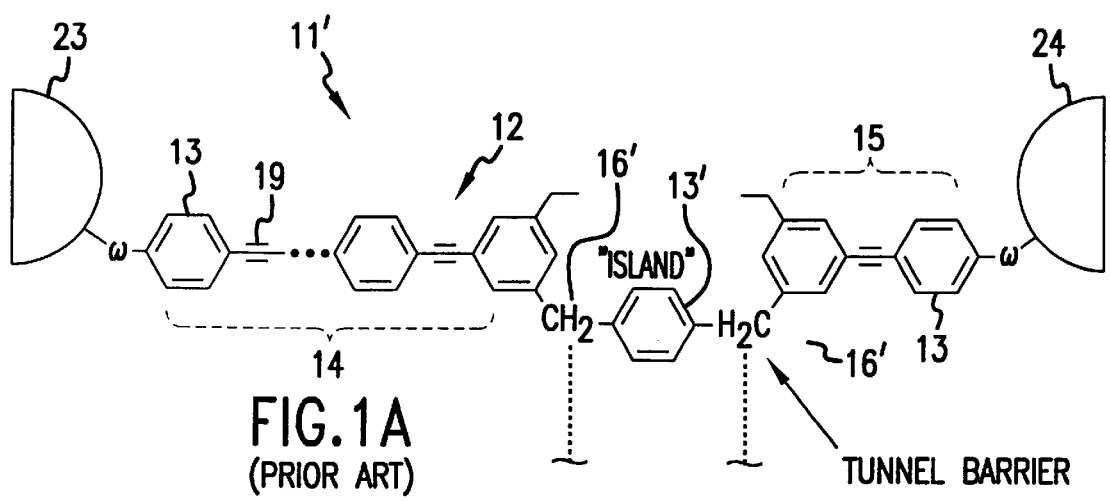
FIGS. 1A, 1B and 1C schematically show the structure and the operation of a molecular resonant tunneling diode demonstrated by Reed and Tour.
Figure 1B:
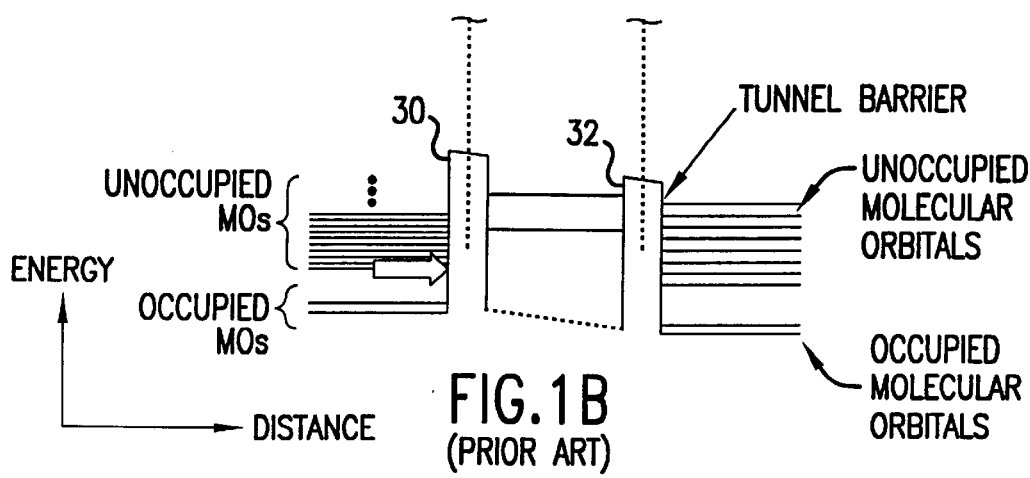
Figure 1C:
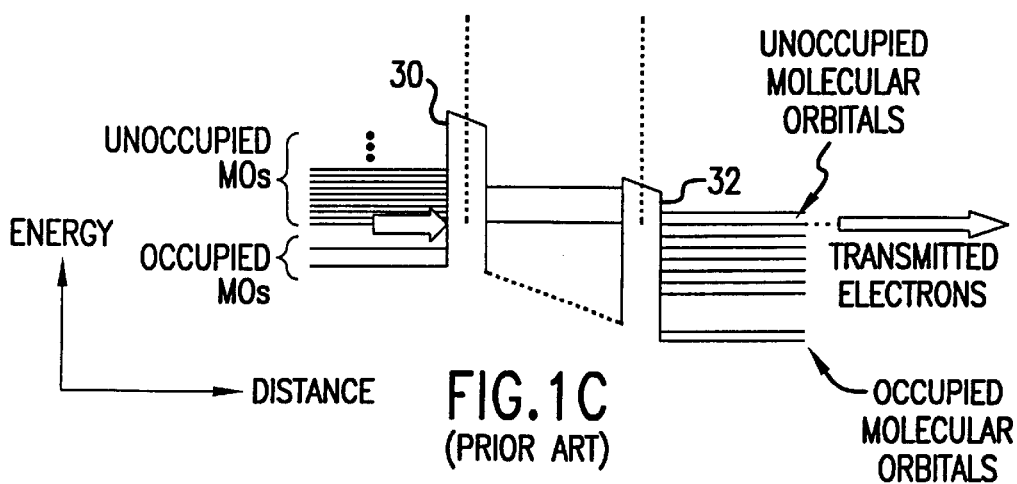

The above-described rectifying diode, like the resonant tunneling diode of FIG. 1A, is useful in constructing Boolean logic functions which may be employed in nano-scale digital circuits. However, such molecular electronic switching devices suffer the same major deficiency, they lack the ability to provide power gain.

Figure 3A:
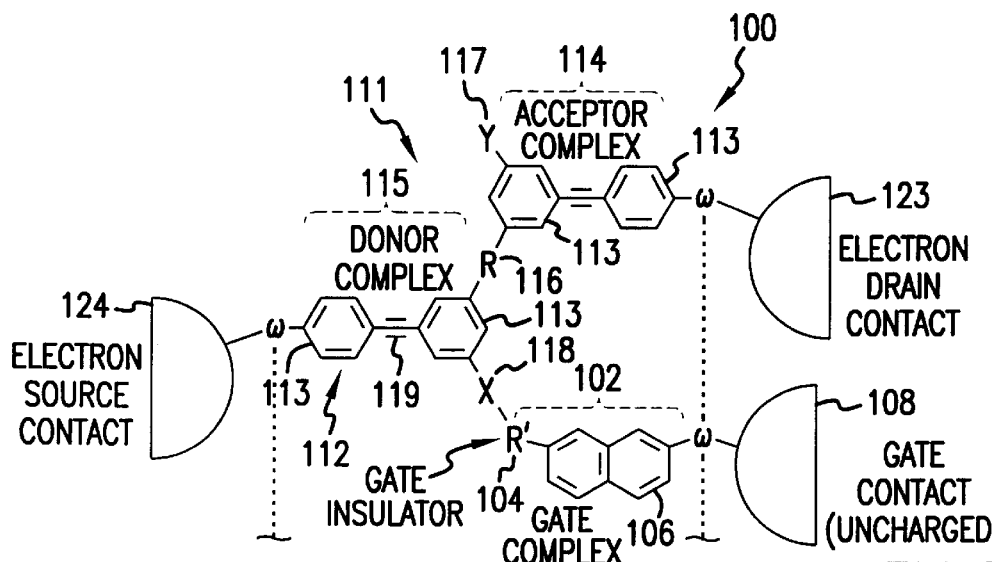
FIG. 3A is an exemplary schematic diagram of the present invention illustrating a three-terminal molecular switching device with the gate in an uncharged state.

In order to achieve power gain, a three-terminal device is required, wherein a small voltage and/or current is applied to a control electrode to influence the switching of a larger voltage and/or current flowing between two other electrodes of the device. In particular, a molecular resonant tunneling transistor can be formed by bonding a gate structure to that of a molecular diode, either rectifying or resonant tunneling, to form a new single molecule that functions as an electrically operated switch and amplifier. An example of such a device is illustrated in FIGS. 3A and 3C, depicting the structure of a molecular resonant tunneling transistor 100 that is formed by the chemical bonding of the molecular gate structure 102 to the molecular structure 111. Taken alone, the molecular structure 111 would define a rectifying diode, the structure and operation of such having been previously discussed. The molecular structure of transistor 100 is functionally an analog of the bulk semiconductor n-channel enhancement mode transistor. Like the solid-state electronic device, the molecular transistor 100 relies upon the strategic use of electron donating and electron withdrawing ("hole" producing) chemical dopants, the dopants 117 and 118, respectively. These dopant chemical substituents 117, 118, which are covalently bonded to the rest of the molecule 112, are represented by X and Y. In accordance with the fundamentals of organic chemistry, a substituent X or multiple substituents X (as previously discussed) is to be understood as an electron donating group. Such a group may include, for example: $-NH_2$, $-OH$, $-OCH_3$, $-CH_3$, $-CH_2CH_3$, and the like. A dopant substituent Y or multiple substituents thereof is to be understood as an electron withdrawing (or acceptor) group. Examples of such substituents include: $-NO_2$, $-CN$, $-CHO$, $-COR'$, and the like, where R' is an aliphatic chain.

As will be seen in following paragraphs, the molecular transistor retains the familiar three-terminal source-drain-gate structure found in a solid-state field-effect transistor. Further, the molecular transistor 100 makes use of resonant switching effects, which effects are well understood in the art. Transistor 100 utilizes the molecular structure of the molecular rectifying diode to form the source and drain regions of the molecular transistor. To produce the molecular resonant tunneling transistor from the molecular rectifying diode "backbone" a third, "gate" terminal is chemically bonded to the diode in order to allow for the application of a small external bias voltage that either counteracts or reinforces the effect of the intrinsic bias induced by the dopant substituents, as a function of the polarity of the gate bias voltage. By that arrangement, quantized molecular energy levels in the source and the drain regions of the structure can be brought into or out of resonance in a controlled manner, and the current passing from the source to the drain can be switched on or off. Further, as the current flowing through the gate structure is substantially less than that which flows between the source and drain, power gain is realized.

Transistor 100 includes an electron source contact 124 which is coupled to the molecular structure 111 through a substituent group ω which chemically binds with the material of the contact 124 to improve the connection between the contact and a distal end of the conducting wire 112, a distal ring 113 of the section 115. Likewise, the electron drain contact 123 is coupled to the opposing distal ring 113 of the conducting wire 112 through the substituent group ω. As an example, if the contacts 123 and 124 are formed of gold, the substituent group ω may be formed by a sulfur atom. Much as described for the rectifying diode, the two sections 114 and 115 of the conducting wire 112 are defined by the insulating group 116 which separates those sections. Here again, although it is shown that each section is respectively doped to induce an intrinsic bias, the energy differential across the insulator 116 also may be produced utilizing only a single dopant 117, 118. Either the X donating group dopant or the Y accepting group dopant would be sufficient. It should also be understood that while the dopants 117, 118 are shown as being bonded to a respective ring structure 113 immediately adjacent the insulator 116, the substituents may be affixed to other parts of the molecule, such as rings that are spaced one or more rings away from the insulator 116. Additionally, the dopant substituents may be chemically bonded to the molecular gate structure to condition it relative to the source-drain channel, or the dopant substituents may be substituted on the insulating barrier groups to condition them relative to the conductive source, drain and gate. In the molecular transistor 100, the gate structure 102 includes a gate insulator 104 identified by R' which is shown to be chemically bonded to the X dopant group 118. As will be discussed in following paragraphs, the gate insulator 104 may be bonded to other portions of the same ring 113 to which a dopant group is bonded, or the gate insulator 104 may be bonded to a different ring 113 of the same section 115, 114. To the gate insulator 104 there is chemically bonded a current conducting complex 106, through which gate current passes and upon which gate charge may accumulate to exert a field effect upon the source-drain component of the molecule. The current-conducting gate complex is coupled to a gate contact 108 through the conductivity improving substituent group ω, which binds chemically to the electrical contact material.

Figure 3B:
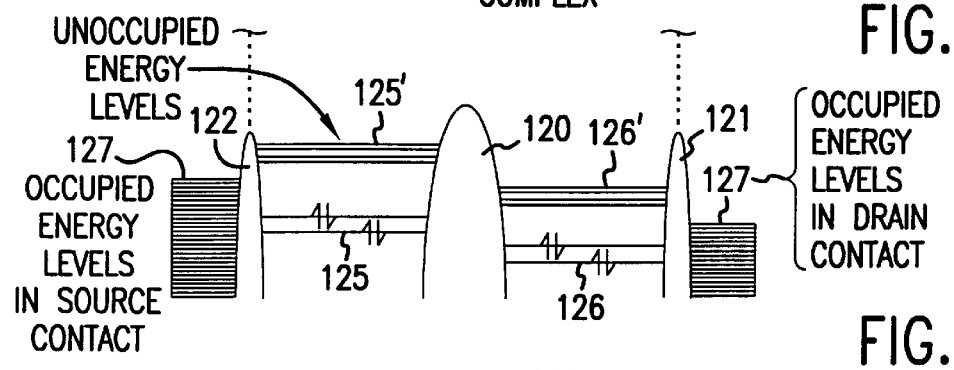
FIG. 3B schematically shows the orbital energy diagram associated with the three-terminal device of FIG. 3A.
Figure 3C:
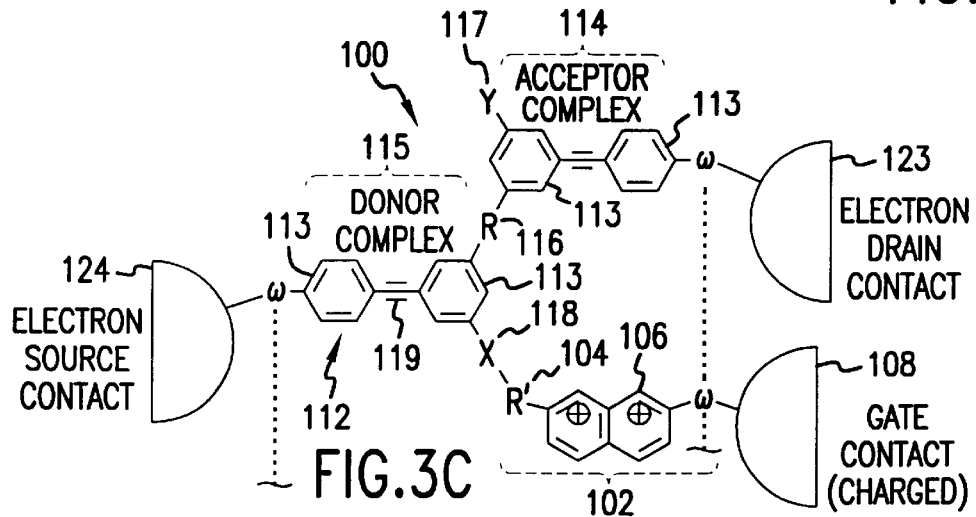
FIG. 3C is an exemplary schematic diagram of the present invention illustrating a three-terminal molecular switching device with the gate in a charged state.
Figure 3D:
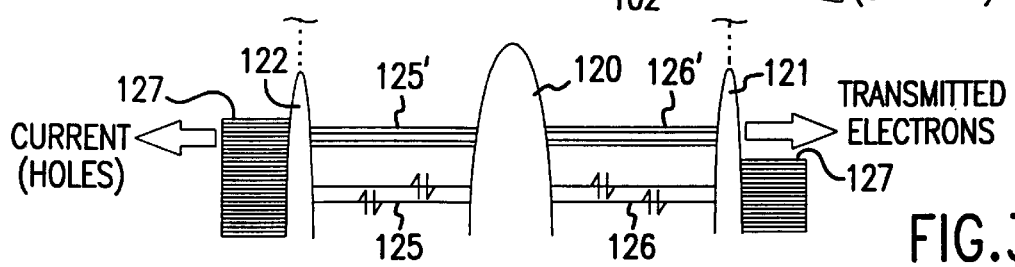
FIG. 3D schematically shows the orbital energy diagram associated with the three-terminal molecular switching device of FIG. 3C.

To understand the operation of molecular transistor 100, FIGS. 3B and 3D should additionally be referred to. In the case of diode structures in FIGS. 1A and 2A, the voltage impressed across the terminals analogous to terminals 123 and 124 is varied in order to induce a switching effect. In the case of molecular transistor device 100 the source-to-drain voltage is maintained constant, with the potential applied to the gate being varied to counteract or reinforce the intrinsic bias that is induced by the dopant substituents and thereby switch the source-drain current. Thus, without a gate voltage being applied to the terminal 108, of FIG. 3A, the energy levels in each of sections 114 and 115 are depicted in FIG. 3B. Much as in the diode structure, the insulator 116 forms a barrier 120 in the energy diagram. As shown, in addition to the central barrier 120, barriers 121 and 122 represent barriers between the molecular structure 111 and the respective conductive contacts 123 and 124, respectively.

With an external voltage applied, as shown in FIG. 3B, the occupied quantum energy levels 127 are like that of the reverse-bias molecular rectifying diode. Due to the applied bias, the Fermi energy of the contact 124 is raised and that of the contact 123 is lowered. Under the reverse-bias condition, the energies of the pi-orbitals 125, 125' of the donor section 115 are greater than that of the corresponding pi-orbitals 126, 126' of the acceptor section 114. That is, the energy levels on the donor complex are out of coincidence with the acceptor complex, which is an impediment to the flow of electrons between the source and drain contacts. However, as illustrated in FIGS. 3C and 3D, the application of a voltage to the gate contact counteracts the intrinsic bias established by the dopant substituents. By that action, the valence pi-orbitals 125, 125' and 126, 126' are placed in resonance to thereby allow electrons to flow from the source contact to the drain contact. As it takes a considerably smaller voltage at the gate than that applied across the source and drain, to influence the donor effect of the dopant group 118, there is also a considerably smaller current passed through the gate than is switched between the source and drain contacts. Thus, like a solid-state semiconductor transistor, the molecular transistor 100 is capable of providing power gain.

Referring to FIGS. 4A–4D, there is shown the molecular resonant tunneling transistor 100', which is an analog of the n-channel depletion mode semiconductor transistor. The transistor 100' includes a gate structure 102 that is chemically bonded to the acceptor section 114 of the polyaromatic chain 112. The primary structural difference between this depletion-mode molecular transistor 100', as illustrated in FIG. 4, and the enhancement-mode molecular transistor 100 illustrated in FIG. 3 is that the former has the gate structure 102 bonded to the acceptor complex 114, while the latter has the gate structure 102 bonded to the donor complex 115.

Figure 4A:
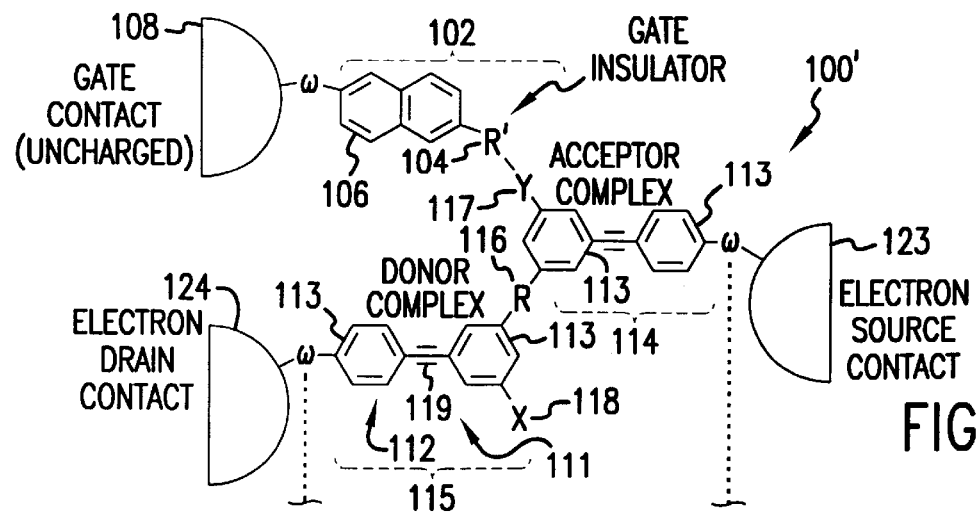
FIG. 4A schematically shows an exemplary alternative configuration of the present invention.

The gate structure 102 includes an insulator 104, represented by R' which is formed by a chemical group that is more insulating than the polyaromatic chain 112. Some candidates for this role include aliphatic groups such as sigma bonded methylene groups (—$CH_2$—) or dimethylene groups (—$CH_2CH_2$—), and longer chains thereof. While the gate insulator 104 is shown in FIGS. 4A and 4C as being bonded to the dopant group 117, it also may be bonded to other sites on the ring 113 to which the dopant group 117 is bonded or rings adjacent thereto. A gate control voltage is applied to the contact 108 and a current is conducted through the current conducting complex 106, through the conductivity improving substituent group ω which chemically binds to the electrical contact 108. The current conducting complex 106 is formed by a polyaromatic conducting wire with sufficient length or capacitance to permit charge to build up on it in order to enhance the field effect upon the donor-acceptor complex. Thus, by using a mesh-like molecular structure, such as the double-ringed naphthalenic group shown, capacitance is increased, thereby reducing the magnitude of the potential that is required to be applied to the gate structure in order to effect "switching" of the molecular electronic device.

Figure 4B:
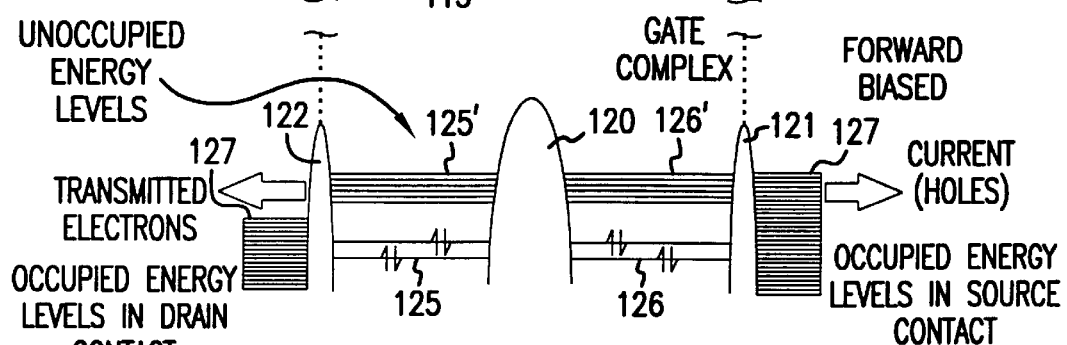
FIG. 4B schematically shows the orbital energy diagram associated with the three-terminal switching device of FIG. 4A.
Figure 4C:
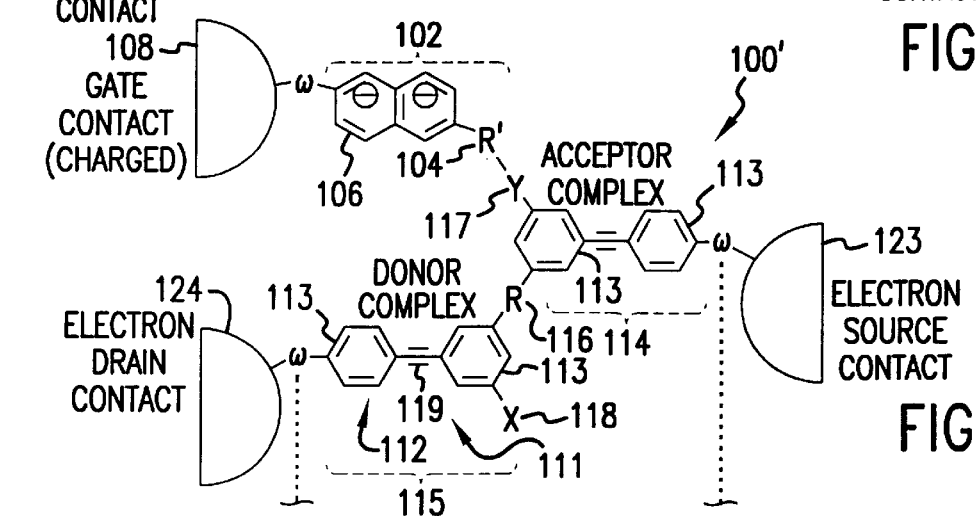
FIG. 4C schematically shows the molecular switching device of FIG. 4A with a charged gate structure.
Figure 4D:
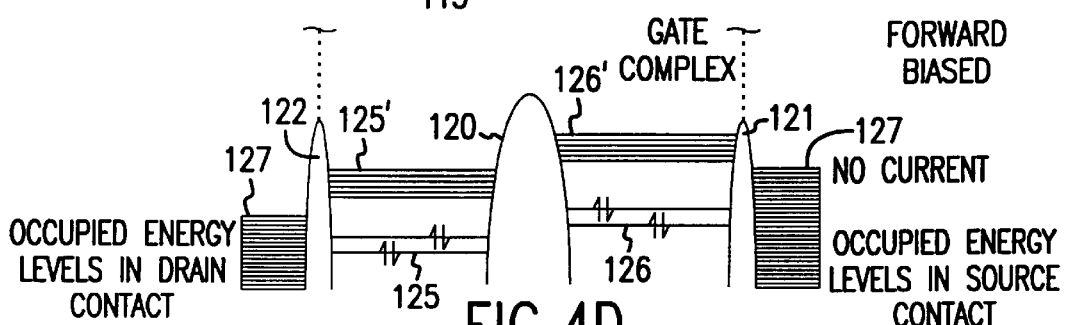
FIG. 4D schematically shows the orbital energy diagram associated with the three-terminal switching device of FIG. 4C.

As shown by the energy diagram of FIG. 4B, the molecular device 100' is doped such that the energy levels of sections 114 and 115 are in resonance under a forward source-drain bias, but without the application of a voltage to the gate contact. With the appropriate negative polarity applied to the gate contact 108, the device switches off because the unoccupied energy levels 126' on the acceptor complex are forced out of coincidence with those levels 125' of the donor complex, as illustrated in the energy diagram of FIG. 4D. For the case where the gate is uncharged, the transistor acts just like a forward-bias rectifying diode.

The switching occurs because the application of a small negative charge to the gate counteracts the effect of the electron withdrawing dopant. The effect of the externally applied gate bias is to raise the energy of the unoccupied energy levels 125', 126' in the conduction band of the acceptor or source region, forcing the energy levels there out of coincidence with those of the donor or drain region of the device. The mismatch between the unoccupied, conduction energy levels 125' and 126' on the donor and acceptor complexes, respectively prevents the occurrence of electron tunneling from source to drain through the central insulating barrier, thereby switching the device off. Like the device 100, the transistor 100' utilizes a small current or voltage applied to the gate structure 102 to control a much larger current or voltage which flows through or is impressed across the drain and source sections, 115 and 114. In this way, the depletion-mode molecular transistor 100' exhibits power gain.

Figure 5A:
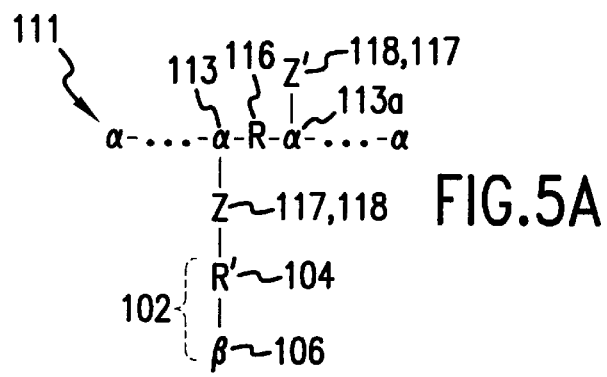
FIGS. 5A, 5B, 5C and 5D each schematically shows a representative molecular structure for the three-terminal switching device of the present invention.

Referring now to FIGS. 5A–5D, there are shown schematic representations of the molecular transistor 100, 100', illustrating some of the variations in the chemical bonding of dopant substituent groups and that of the gate structure 102. In FIG. 5A, the transistor is formed by combining the polyaromatic molecular structure 111 with the gate molecular structure 102 to form a new single molecule. The molecular structure 111 includes a plurality of sequentially coupled substantially identical aromatic ring structures 113, including any intermediate linkage groups, represented by the symbol α. As the rings 113 can be other than benzene rings, such as cyclopentadiene, cyclopropene, or combinations thereof, the symbol α is utilized to represent any ring molecular structures having substantially aromatic character, as previously discussed. In order to create the intrinsic bias across the insulator 116, represented by the symbol R, a dopant substituent group 117, 118, represented by the symbol Z, is bonded to a ring 113 in proximity to the insulator 116. On the section of the molecular structure 111 on the other side of insulator 116, the opposite dopant group 118, 117 represented by the symbol Z' is bonded to the ring 113a. The dopant group Z' has the opposite character from that of Z; i.e., if Z is a donor dopant group then Z' is an acceptor dopant group, and vice-versa. The gate structure 102 is bonded to the dopant group Z. This gate structure includes an insulating group 104 represented by the symbol R' to which is coupled a current conducting complex 106, represented by the symbol β.

Figure 5B:
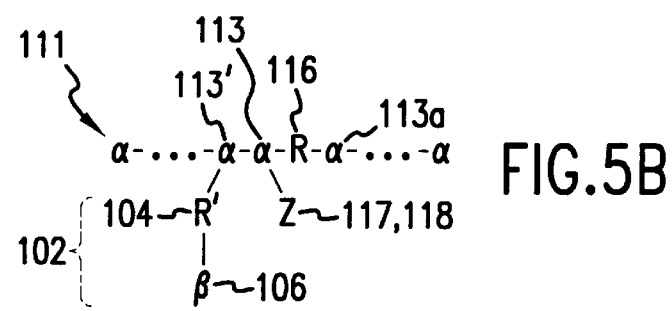

FIG. 5B illustrates a molecular transistor wherein the gate structure 102 is not bonded directly to the dopant substituent group 117, 118. The dopant substituent group Z may be either an electron donor group or an electron withdrawing group, bonded to the ring 113 of one section of the molecular structure 111, on one side of the insulator 116. If a larger disjunction $\Delta E_{LUMO}$ between the unoccupied energy levels on either side of the insulator 116 is desired, an electron donor group or electron withdrawing group Z' of the opposite type from Z would be coupled to the ring 113a, like that illustrated in FIG. 5A. In FIG. 5B, the gate structure 102 is chemically bonded to a ring 113', a ring that is adjacent to the ring 113, to which the dopant group Z is bonded. The gate structure 102 includes a gate insulator 104, symbolized by R', plus a current conducting complex 106, symbolized by β.

Figure 5C:
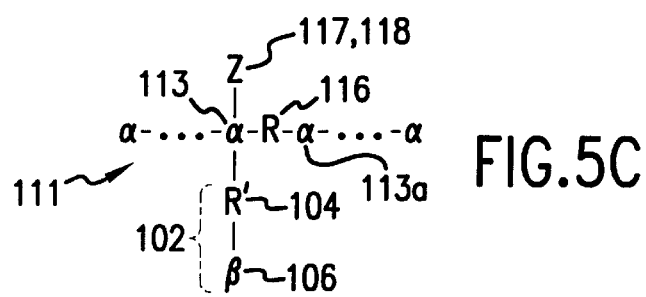

As a further variation, FIG. 5C illustrates the gate structure 102 being joined directly to the same ring 113 as the dopant group Z. As in the prior cases, a dopant group of the type opposite from Z may be bonded to the ring 113a in order to widen the energy difference $\Delta E_{LUMO}$ across the insulating group R. The dopant group Z may be either an electron withdrawing group 117 or an electron donor group 118, that is bonded to one site of the ring 113. Bonded to another site of the ring 113 is the insulator 104, which also is bonded to the current conducting complex 106.

Figure 5D:
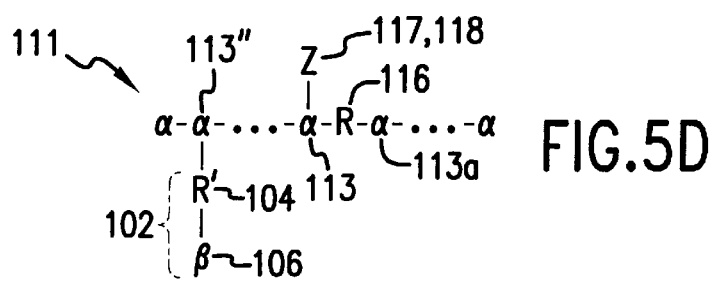

In yet another variation, shown in FIG. 5D, the molecular structure 111 illustrates the case where the gate structure 102 is bonded to a ring that is not adjacent to the ring to which a respective dopant is bonded. The dopant Z, which may be an electron withdrawing group 117 or an electron donor group 118, is bonded to the ring 113 in one section defined by the insulator group 116. As in the other cases, an opposite type of dopant 118, 117 may be bonded to the ring 113a in order to increase the energy difference $\Delta E_{LUMO}$ between the unoccupied energy levels on either side of the insulator group R. The gate structure 102 is bonded to a ring 113" in the same section as ring 113 to which the dopant group is bonded. However, ring 113' is displaced from ring 113 by more than one ring position (the single ring position displacement case was shown in FIG. 5B).

Figure 6:
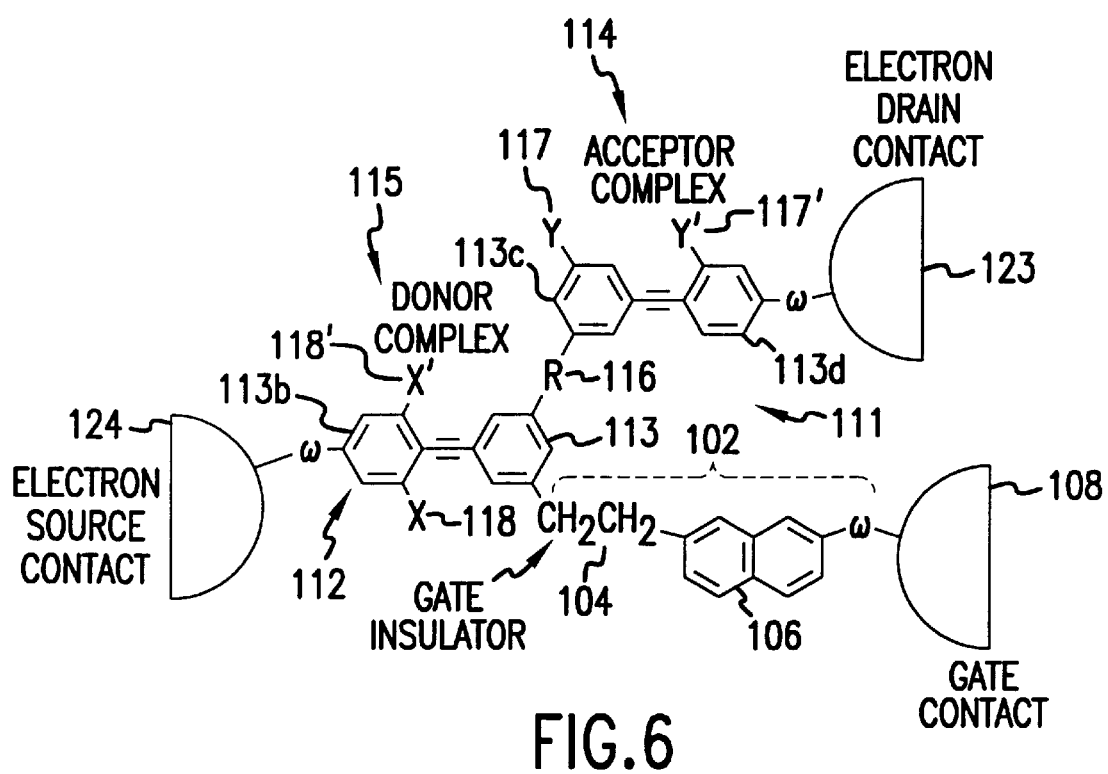
FIG. 6 shows an alternative exemplary three-terminal molecular switching device of the present invention.

Another alternative is shown in FIG. 6, wherein multiple dopant groups are utilized on one side of the central insulator R and the gate structure 102 is joined to the ring 113, a ring which is devoid of coupling to a dopant group. In this case, the polyaromatic molecular conducting wire 112 is divided into two sections 114 and 115 by the insulator group 116, represented by the symbol R. The acceptor section 114 includes a ring 113c adjacent the insulator 116 and to which is bonded a first acceptor dopant group 117, represented by the symbol Y. A second acceptor dopant group 117', represented by the symbol Y' is bonded to an adjoining ring 113d. The ring 113d is coupled to the drain contact 123 through the conductivity improving constituent group ω. Section 115, on the other hand, is shown with a first electron donor group 118, represented by the symbol X, bonded to the ring 113b and a second electron donor group 118', represented by the symbol X', also bonded to the same ring 113b. Disposed between the ring 13b and the insulator 116 is the ring 113 to which the gate structure 102 is joined. As in the section 114, the two electron donor groups 118 and 118' alternately may be joined to each of the two different rings 113 and 113b. Conversely, the two electron withdrawing groups 117 and 117' may be joined to a single ring 113c, 113d. By virtue of these variations in location and number of dopant groups, precise control of the energy difference $\Delta E_{LUMO}$ across the insulator 116 can be achieved. The gate structure 102 includes the dimethylene group 104 as a gate insulator and the polyaromatic conducting wire 106 as the current conducting complex, that is joined to the dimethylene group and the gate contact 108 through the substituent ω. As an example, the polyaromatic conducting wire 106 is shown as a naphthalenic group, the double-ringed structure of which provides an increased capacitance over that of a single-ring structure.

The concept of creating a molecular transistor by the addition of a gate structure to a doped molecular diode is not limited in its applicability to only molecular rectifying diodes. By the addition of dopant groups 117, 118 and the gate structure 102 to a molecular resonant tunneling diode 202, a molecular resonant tunneling transistor 200 can thus be formed, shown in FIG. 7A. The conventional structure of the molecular resonant tunneling diode 202 (as is also shown in FIG. 1A), acceptor dopant groups 117 are joined to respective rings 210b and 210c, of the respective sections 232 and 234, which are located on opposite sides of the ring 235 that constitutes the "island" of the resonant tunneling diode. As is conventional, the island ring 235 is separated from the section 232 by an insulating group 236 that acts as a barrier through which electrons must tunnel for conduction to occur. The island 235 is joined to the section 234 through another insulator group 238 which acts as a second barrier through which electrons must tunnel for conduction to occur. To the island ring 235 a donor dopant group 118 is joined so that an intrinsic bias will be formed across both barrier groups 236 and 238, which intrinsic bias can then be influenced by an external potential applied to the gate structure 102. The gate structure 102 includes an insulating group 104 that is joined to the electron donor dopant group 118. The current conducting complex 106 is formed by a polyaromatic conductive structure like that of a molecular conducting wire, having linked aromatic rings 213a and 213b. Obviously, longer chains or meshes of aromatic rings or molecular structures having substantially aromatic character can be used to form the current conducting complex 106. The distal end of the current conducting complex is joined to a gate electrode 108 through the substituent group ω. By this arrangement, conduction between the electrodes 230 and 240 can be influenced by the application of a potential of predetermined polarity to the gate electrode 108. Specifically, a positive voltage applied to the gate electrode 108 will tend to counteract the effect of the dopant X, 118, bonded to the island 235. Thereby the positive gate voltage tends to lower the unoccupied conduction energy levels of the island and bring them more nearly into coincidence with the corresponding unoccupied conduction energy levels on the regions 232 and 234 to the left and right. A sufficient positive voltage applied to the gate will bring these three sets of energy levels on 235, 232, and 234 into coincidence, switching the molecular transistor on. This gate voltage still is significantly smaller, though, than the voltage that may be applied to drive a current from the source to the drain electrodes. Thus, power gain is achievable in this device.

Figure 7A:
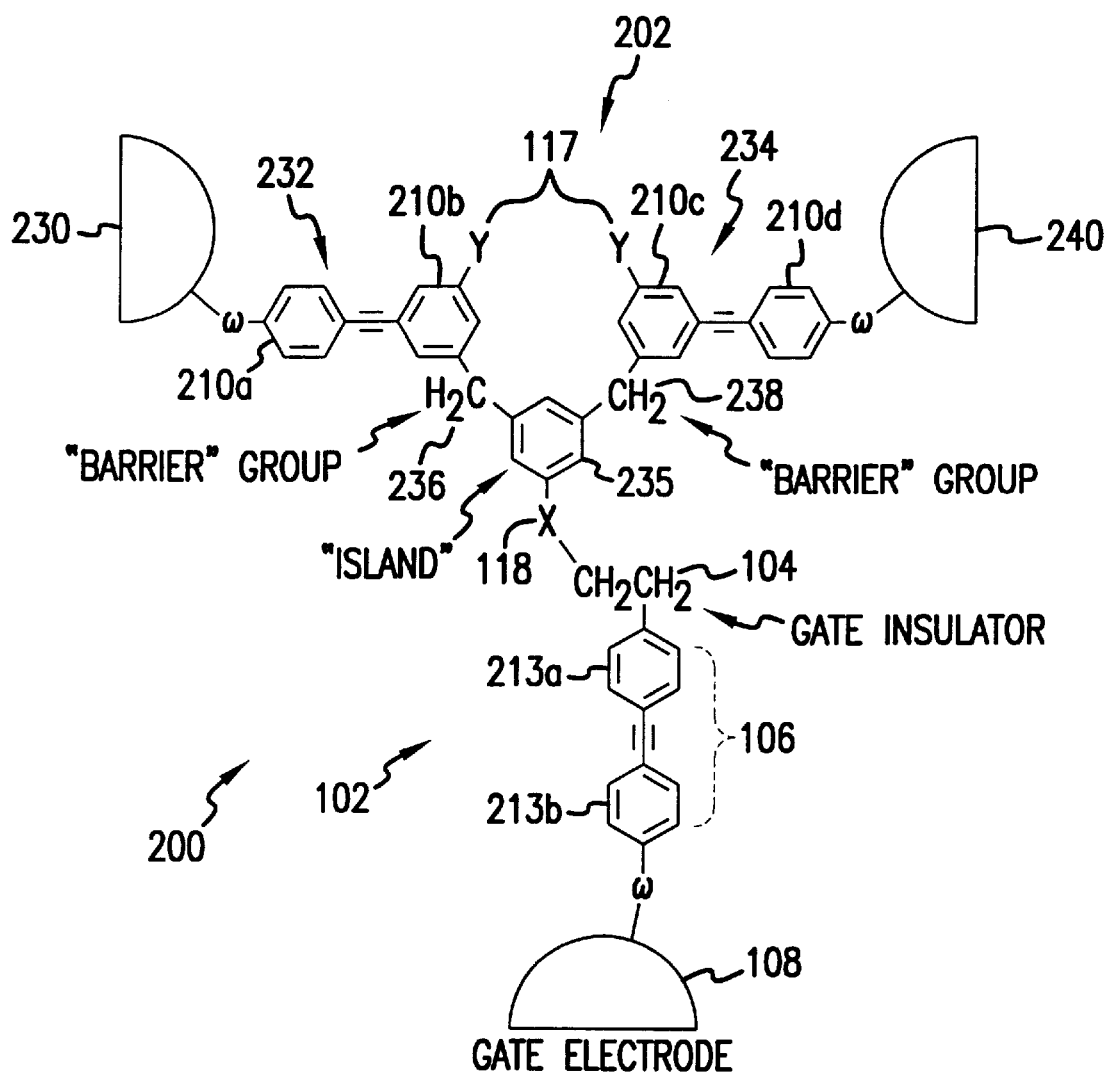
FIG. 7A shows an exemplary three-terminal switching device of the present invention utilizing a molecular resonant tunneling diode to which dopant groups and a molecular gate structure are bonded.
Figure 7B:
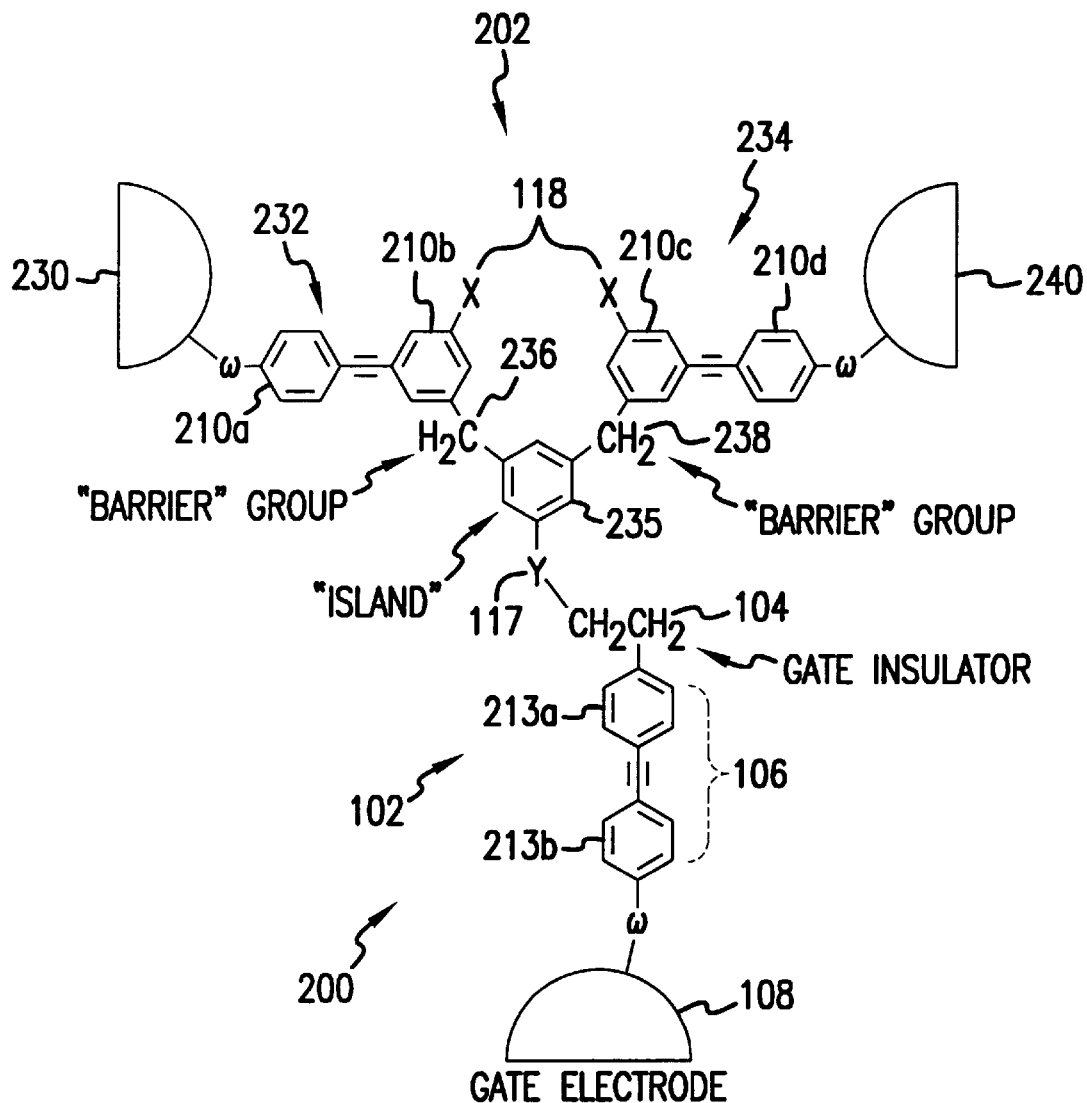
FIG. 7B shows another alternative exemplary three-terminal switching device of the present invention utilizing a molecular resonant tunneling diode to which dopant groups and a molecular gate structure are bonded.

FIG. 7B illustrates an alternative structure to that shown in FIG. 7A. The variation in FIG. 7B differs structurally from that in FIG. 7A only in that the type of dopant group is interchanged at each of three positions where dopant groups are bonded chemically to the structure. That is, in FIG. 7B an electron withdrawing dopant 117 is bonded to the island ring and to the gate insulator, whereas an electron donating type of dopant 118 is bonded in the corresponding position in FIG. 7A. Likewise, the electron donating dopants 118 on the polyaromatic conducting wires to the left and right of the island in FIG. 7B are of the opposite type from the dopant substituents 117 that appear in the corresponding position in FIG. 7A.

Switching the types of all the dopant groups to produce the resonant tunneling transistor structure in FIG. 7B from that in FIG. 7A also means that, operationally, a voltage of the opposite polarity must be applied to the gate electrode 108 in 7B to switch the device on. That is, one must apply a small negative voltage to the gate electrode in FIG. 7B to counteract the effect of the doping and to bring into coincidence all the conduction energy levels on the three parts of the molecule 232, 235, 234, thereby allowing current to flow from the source to the drain. As in FIG. 7A, the current conducting complex may be formed by a multiple ring structure having an aromatic character, such as that of a polyaromatic conducting wire.

Having constructed a resonant tunneling transistor in the form of a single molecule, it is now possible to further modify that molecule to achieve the functionality of a NOT gate. As shown in the schematic in FIG. 8A, for a general case, the NOT function is readily achieved by coupling a resistor 304 between the source 306 of transistor 302 and the output terminal C. In addition to being coupled to one end of the resistor 304, the source 306 is coupled to a power source of positive polarity. The drain 308 is coupled to the negative polarity side of the power supply which may be a ground reference potential. The input terminal A is coupled to the gate 304 of transistor 302. As is well known, such a circuit arrangement provides an output signal at terminal C that is the inverse of the input signal applied to terminal A, operating as a classical inverter.

Figure 8A:
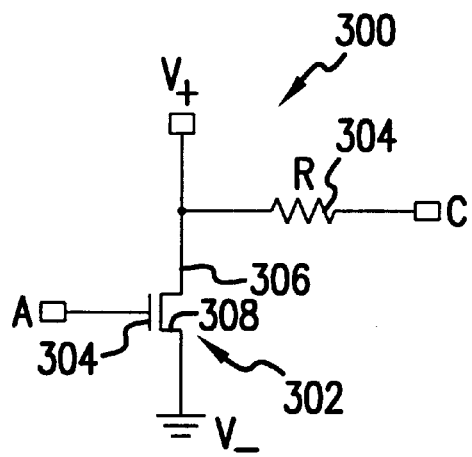
FIGS. 8A, 8B and 8C, respectively, show schematically a circuit diagram for an inverter, a representative molecular structure for an inverter of the present invention, and an exemplary polyphenylene-based molecular inverter of the present invention.
Figure 8B:
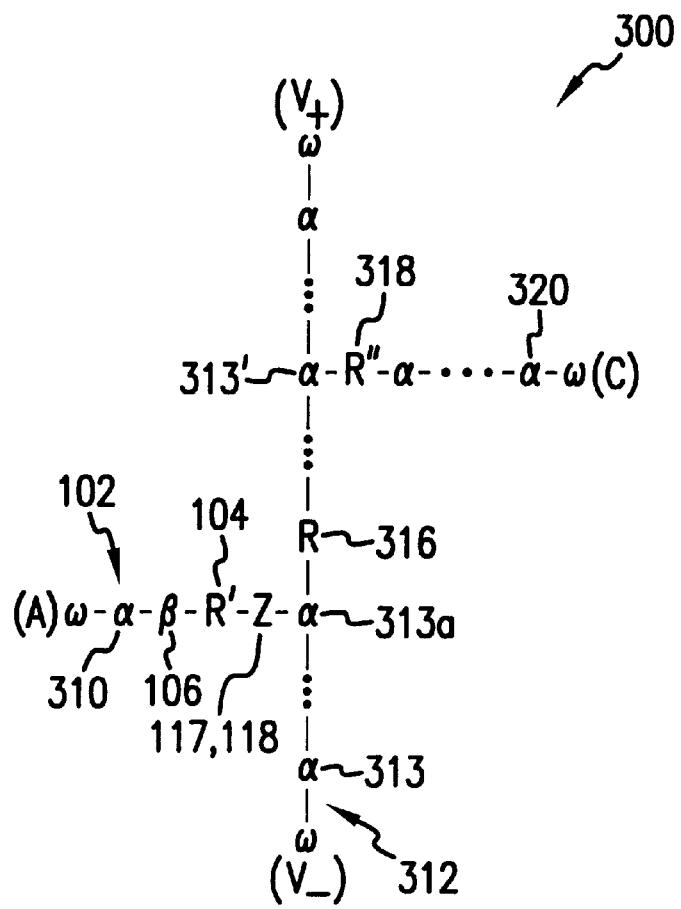

The diagram shown in FIG. 8B represents a single molecule that performs the inverter function and is a molecular electronic implementation of the general circuit shown in FIG. 8A. To the polyaromatic conducting wire molecular structure 312, an insulating group R, 316, is inserted and at least one dopant group Z, 117, 118, is bonded to the ring 313a. The gate structure 102 includes a gate insulator group R', 104, a current conducting complex β, 106 is bonded to the insulator group 104, and one or more aromatic rings 310. The complex 106 may differ from the rings 310 in that the rings thereof are joined in such a manner to increase their capacitive effect. The equivalent of the resistor 304 in the FIG. 8A is provided by the insulator group R", 318 bonded between a ring 313' and a molecular conducting wire formed by linked aromatic rings 320.

Figure 8C:
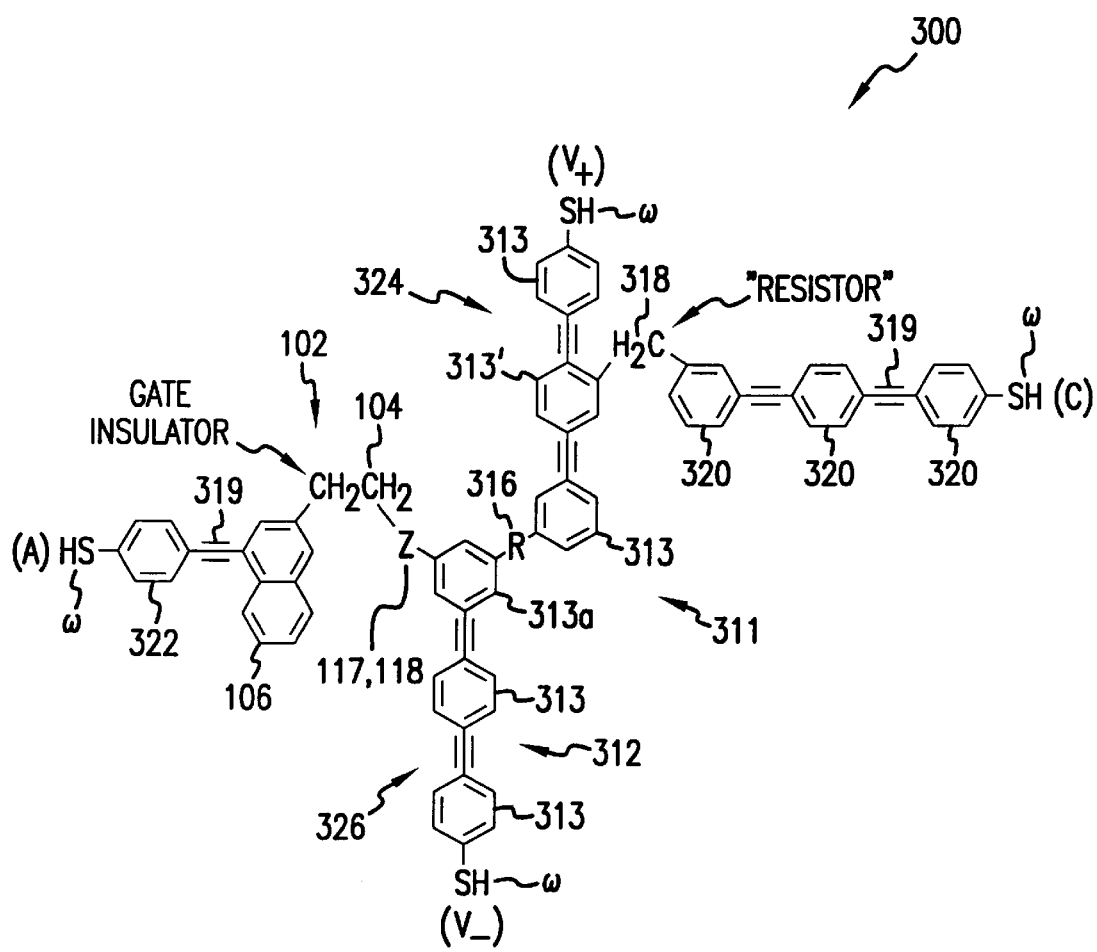

Referring now to FIG. 8C, there is shown an exemplary molecular structure for a polyphenylene-based molecular electronic NOT gate or inverter 300. The backbone molecular diode structure 311 is formed by a molecular conducting wire 312 into which the insulator group 316 is substituted, thereby defining two sections 324 and 326. At least one of an electron donor dopant 118 or an electron accepting dopant 117 is joined to the section 326 as the dopant Z, the dopant Z being chemically bonded to the ring 313a of the polyaromatic structure. As discussed previously, an opposite type of dopant 118, 117 may be joined to the rings 313, 313' of the section 324 in order to increase the difference in energy $\Delta E_{LUMO}$ between the conduction bands on either side of the insulator 316. In this example, the gate structure 102 is joined to the dopant group Z to form a transistor structure. The gate structure 102 includes a gate insulator group 102 formed by a dimethylene group, and a current conducting complex 106 formed by the double-ringed naphthalenic group which molecular structure also can retain some charge to enhance the field effect for switching the transistor. The current conducting complex 106 may be joined through triply bonded ethynylene linkages 319 to one or more further aromatic rings, such that the entire gate structure 102 is coupled to the input terminal A through the substituent ω that binds to the material of the physical contact to which an external voltage is applied. In the Figure the specific ω group shown is HS, a thiol group. In practice when this group binds to a metallic gold contact, the hydrogen atom is displaced, leaving only the S atom between the organic molecule and the metal contact. The resistor 304 of the circuit shown in FIG. 8A is formed by a methylene insulator group 318 which is joined to a ring 313' of the section 324. A molecular conducting wire formed by a plurality of polyaromatic rings 320 with ethynylene linkages 319 therebetween provide the conductive coupling between the insulating group 318 and the output terminal C. The polyaromatic ring structure is coupled to the output terminal by the thiol substituent ω, which substituent binds to such contact materials as gold, as noted above. The value of the resistor formed by the insulating group 318 can be adjusted by utilizing a variety of groups having lower conductivity than that of the polyaromatic molecular structure, and by interposing such multiple insulator groups into a molecular conducting wire, using conventional organic chemistry techniques, such as substitution or technologies such as mechanosynthesis and chemosynthesis. The respective opposite ends of the diode molecular backbone structure 311 are coupled to power supply terminals of opposite polarities V+ and V−, in order to provide the desired bias between the source and drain regions.

Figure 9A:
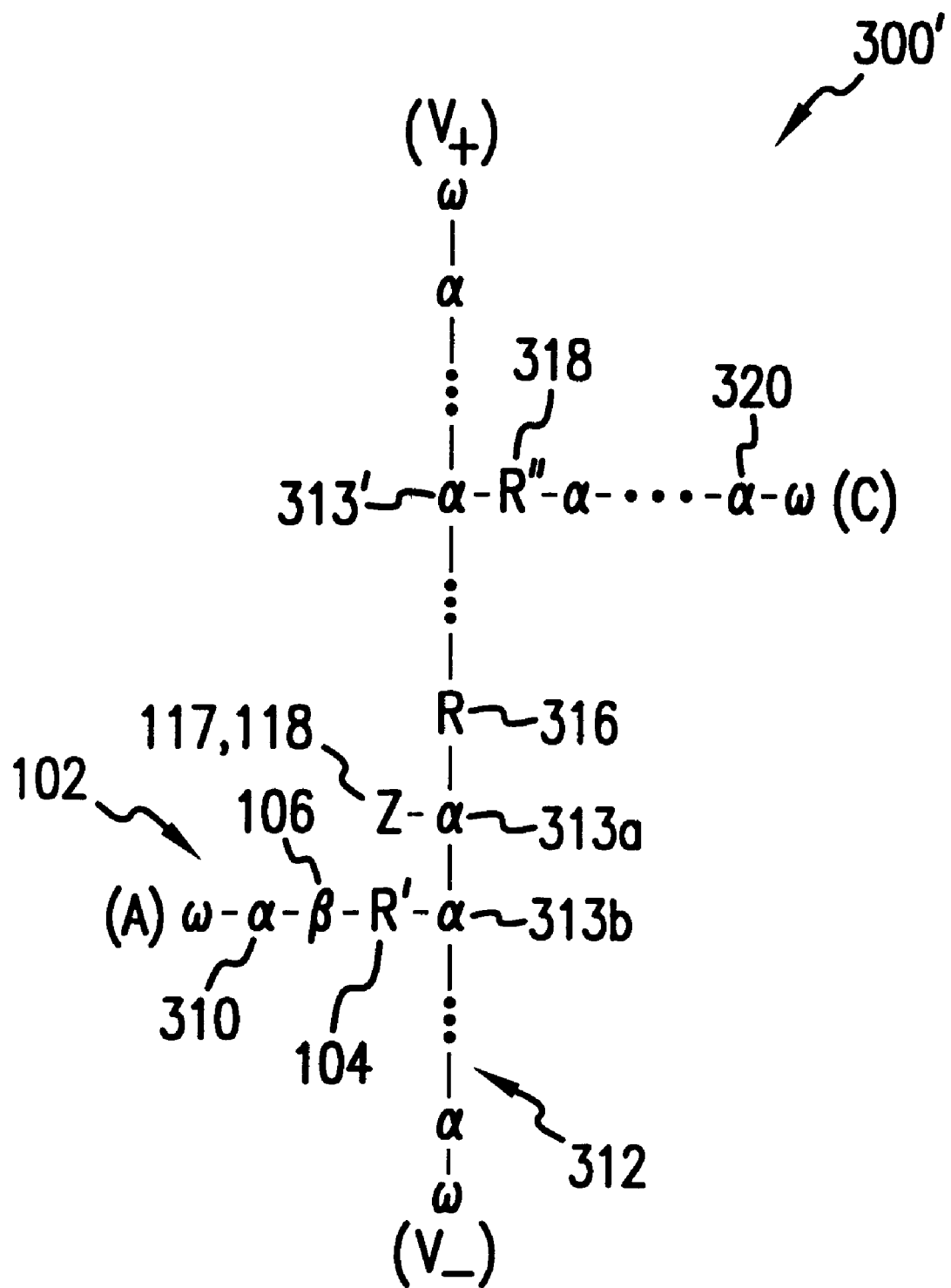
FIGS. 9A and 9B, respectively, show schematically an alternative representative molecular structure for the inverter of the present invention, and an exemplary polyphenylene-based molecular structure of the inverter of FIG. 9A.

Another alternative molecular implementation for the inverter shown in FIG. 8A is represented by the structure shown in FIG. 9A. The inverter 300' utilizes a molecular transistor structure like that shown in FIG. 5B, wherein the dopant Z, which may be either an electron withdrawing group 117 or an electron donating group 118, is joined to the ring 313a and the gate structure 102 is joined to a different, but adjacent ring 313b. In addition to the gate insulator 104 and current conducting complex 106, the gate structure 102 may include additional aromatic rings 310 to provide a conductive path to the terminal that provides the input A. To that molecular transistor structure a resistor defined by the insulating group 318 and having the symbol R" is joined to an aromatic ring 313' of the section of the molecular structure 312 that is not a part of the gate structure 102. The insulator group 318, which functions as a resistor, is coupled to one or more aromatic rings 320 in order to provide a conductive coupling with a terminal that represents the output C.

Figure 9B:
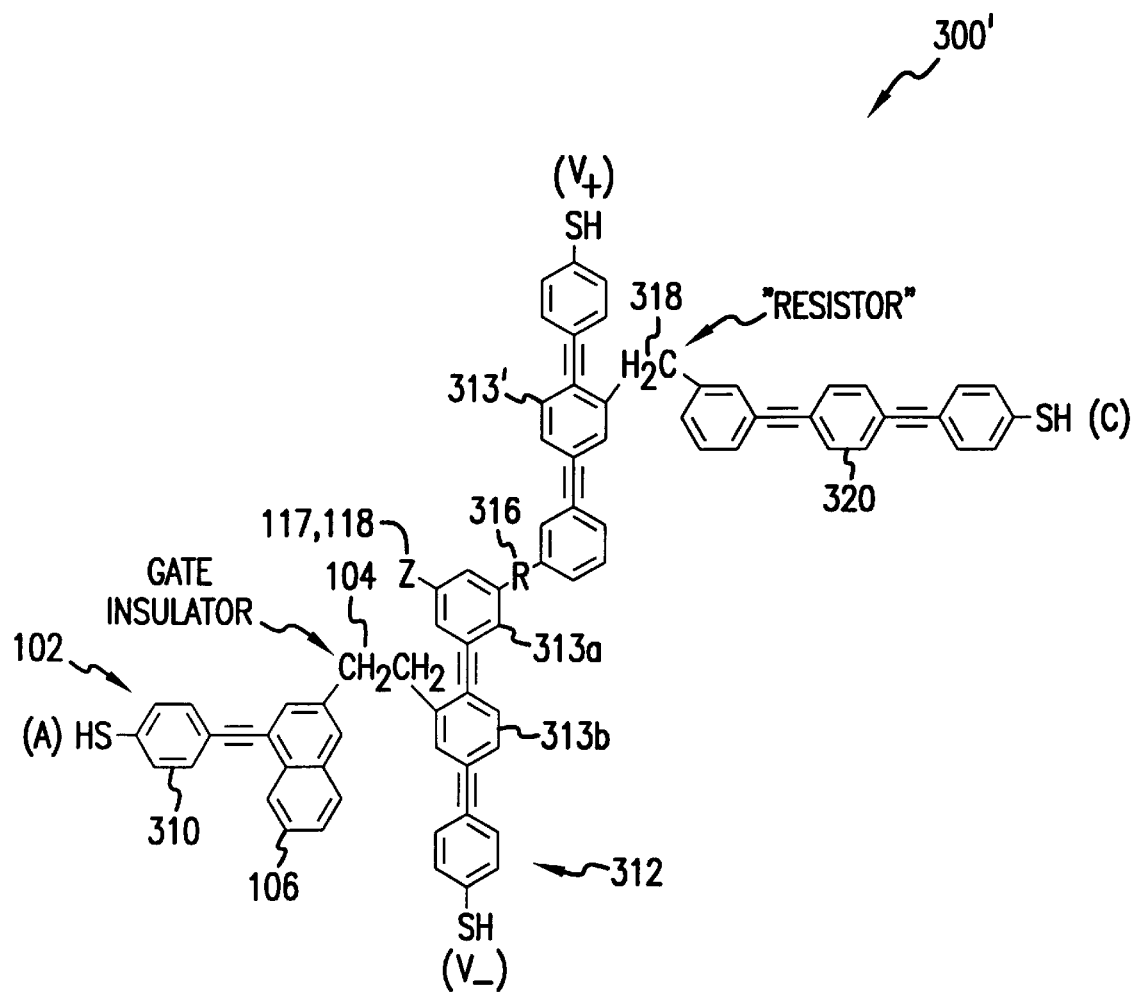

An exemplary molecular structure corresponding to FIG. 9A is shown in FIG. 9B. Therein the polyaromatic structure is formed by benzene rings with ethynylene linkages, and the gate structure 102 is coupled to the ring 313b while the dopant Z is joined to the ring 313a. A dimethylene group 104 forms the gate insulator and the naphthalenic group forms the current conducting complex 106 that is further joined to one or more additional benzene rings for coupling to a contact for which the thiol substituent has an affinity. The gate contact thus forms the input A to the ring 313', to which is bonded a methylene insulator group 318 that functions as a resistor, impeding the flow of electrons through the plurality of aromatic rings 20 to the output C.

From the preceding examples, depicted in FIGS. 8 and 9, it should be clear that any of the alternative molecular transistor structures previously discussed in association with FIGS. 3—7 can be utilized to form a monomolecular NOT gate, a circuit which functions as an inverter, and which is in the form of a single molecule.

The joining of multiple molecules to form a larger molecule, to which the substitution and the chemical binding of further substituent groups is made to form a still larger molecule involves procedures that are well known in the organic chemistry and nano fabrication arts. Utilizing such techniques, a molecular diode, either rectifying or resonant tunneling, is modified by the addition of a gate structure to form a larger molecule. This converts the diode switch to a molecular transistor, a switch, which exhibits power gain. The molecular transistor thus produced may then be modified further by adding molecular groups that function as a resistive circuit element to form an inverter function, the function of a logical NOT gate.

Additionally, by combination of this elementary molecular NOT gate circuit with molecular circuits that perform still other elementary logic functions (e.g., AND, OR, and XOR), even more complex molecular electronic logic functions can be produced. These logic functions are implemented by still larger single molecules. In this way, it is possible to construct a single molecule that exhibits a complex Boolean function. Examples of such Boolean functions may be that of a NAND gate, an XNOR gate, and a HALF-ADDER, and any combination thereof.

Figure 10A:
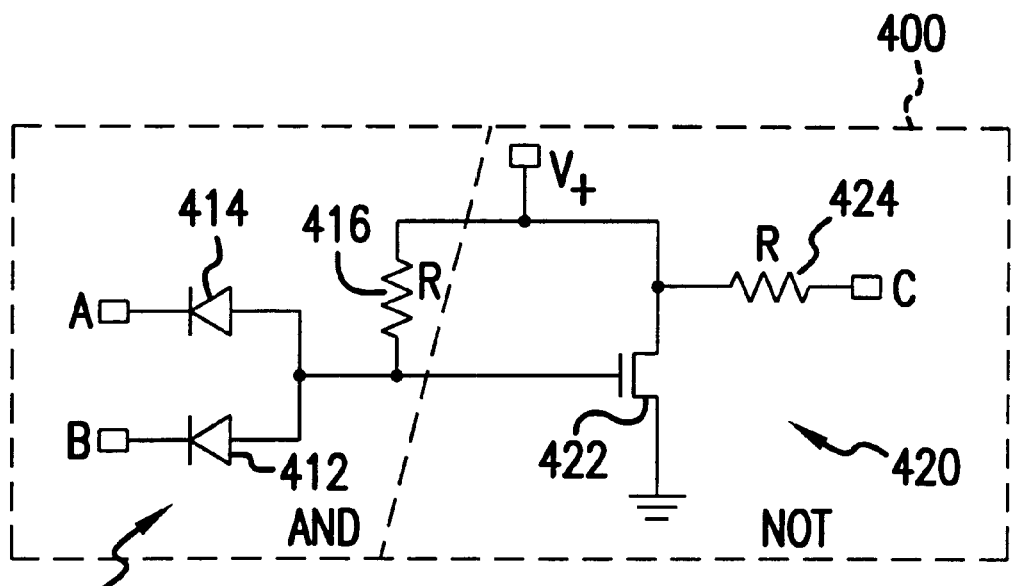
FIGS. 10A and 10B, respectively, show a schematic electrical circuit diagram for a NAND gate, and an exemplary polyphenylene-based molecular NAND gate of the present invention.

Referring to FIG. 10A, there is shown a general schematic circuit diagram representing a NAND gate 400 with binary input signals A and B and the binary output signal for the logical result output at C. The inputs A and B are supplied to a diode-diode AND logic gate 410. The output of that AND gate is further coupled to an inverter 420 to provide the NOT function that produces the NAND output. In the process, the NOT function also provides gain or amplification for the output result. The AND gate 410 is formed by two rectifying diodes 412 and 414, and a resistor 416. The inverter 420 includes a transistor 422 for which the gate lead is coupled to the output of the AND logic gate. Then, the source of transistor 422 provides the inverted output through resistor 424.

Figure 10B:
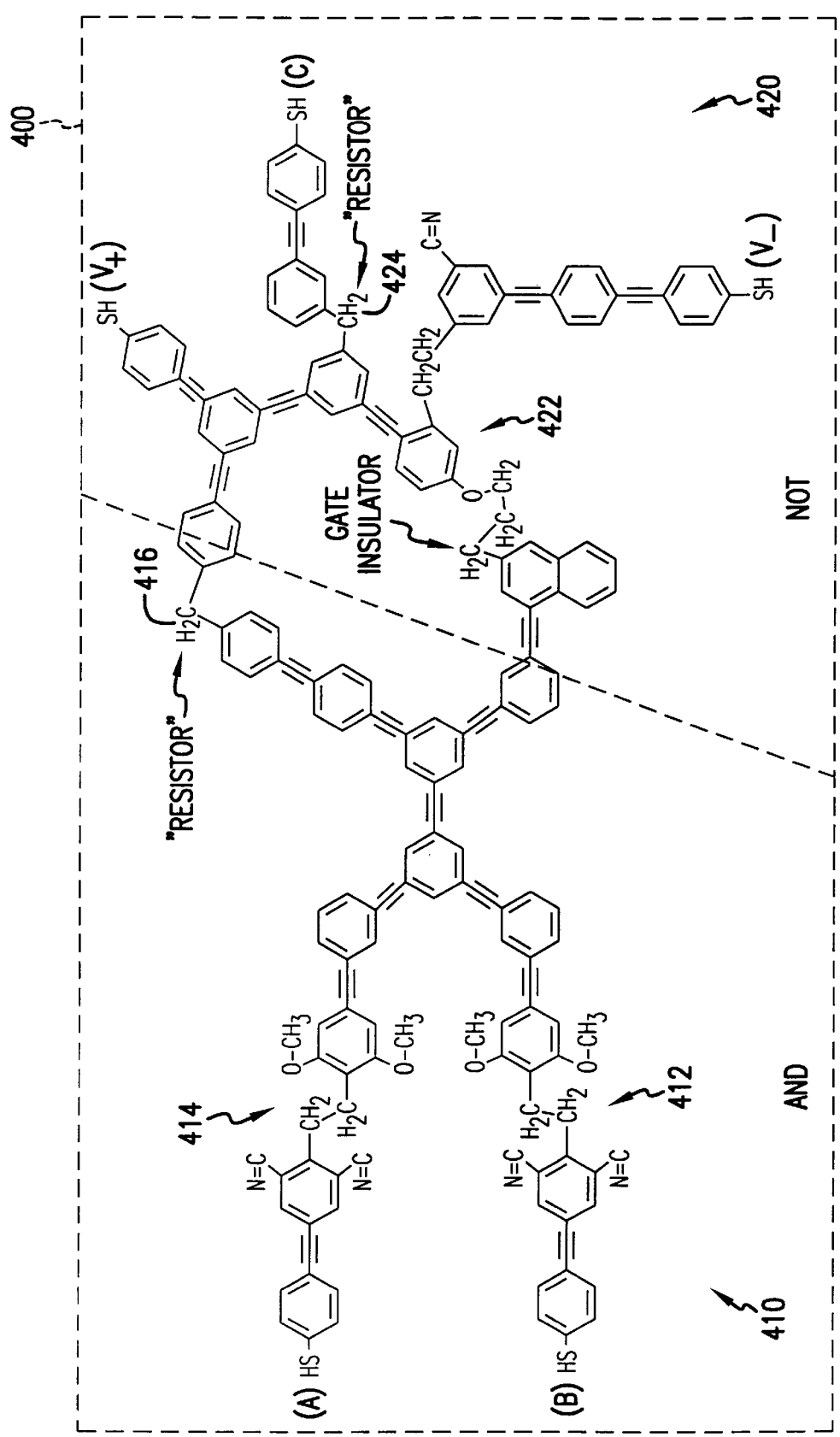

An exemplary molecular structure that performs the NAND function is shown in FIG. 10B. The NAND gate 400 is shown to be formed by the molecular diodes 412 and 414 having their anode ends joined together to which a resistor formed by an insulator group 416 is coupled, with an opposite end of that resistor being coupled to the positive polarity power supply input. The node joining the two diodes 412 and 414 is coupled to the transistor 422, the transistor having a source section to which the insulator group 424 defines a resistor, impeding electron flow to the output C. Utilizing a polyphenylene conducting wire with appropriate doping and insulator groups, a single molecule is produced that performs the specified Boolean function, that of a NAND gate, and the molecule also yields power gain. The power gain enables the logic gate 400 to support what is known as "fan out" in subsequent logic steps, the ability to drive multiple logic circuits from the output C of the NAND gate.

Figure 11A:
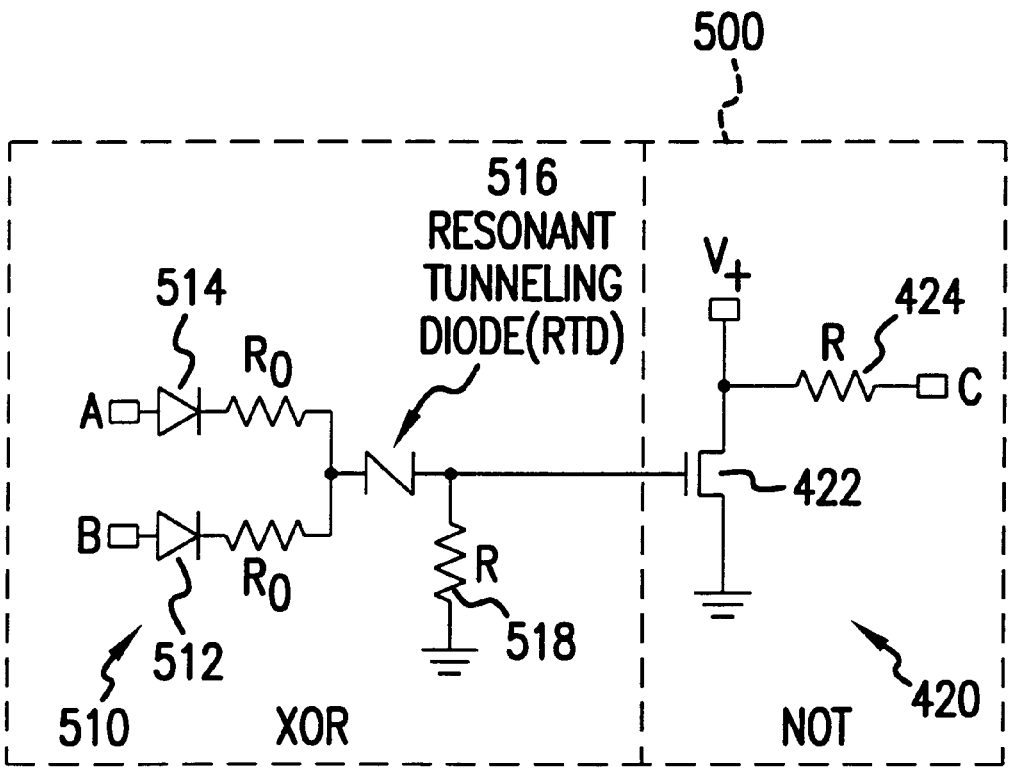
FIGS. 11A and 11B, respectively, show a schematic electrical circuit diagram for an XNOR gate, and an exemplary schematic diagram for a polyphenylene-based molecular XNOR gate of the present invention; and, FIGS. 12A and 12B, respectively, show a schematic electrical circuit schematic circuit diagram for a HALF ADDER, and an exemplary schematic diagram of a polyphenylene-based molecular HALF ADDER of the present invention.

In FIG. 11A, there is shown a general schematic circuit diagram representing an XNOR gate 500 with binary input signals A and B and the binary output signal for the logical result output at C. The inputs A and B are supplied to a diode-diode XOR logic gate 510. The output of that XOR gate is further coupled to the inverter 420 to provide the NOT function that produces the XNOR output. As in the case of the NAND gate, the NOT function also provides gain or amplification for the output result. The XOR gate 510 is formed by two rectifying diodes 512 and 514 having their cathodes joined together through respective resistances $R_o$. The node connecting the two resistances $R_o$ is coupled to a resonant tunneling diode 516 on one end thereof, the opposite end of the diode being coupled to a load resistance 518, and that end of the diode also provides an output of the XOR gate. The output from the XOR logic gate 510 is coupled to the gate lead of transistor 422. The resistor 424 of the inverter 420 couples the source of the transistor to the output C.

Figure 11B:
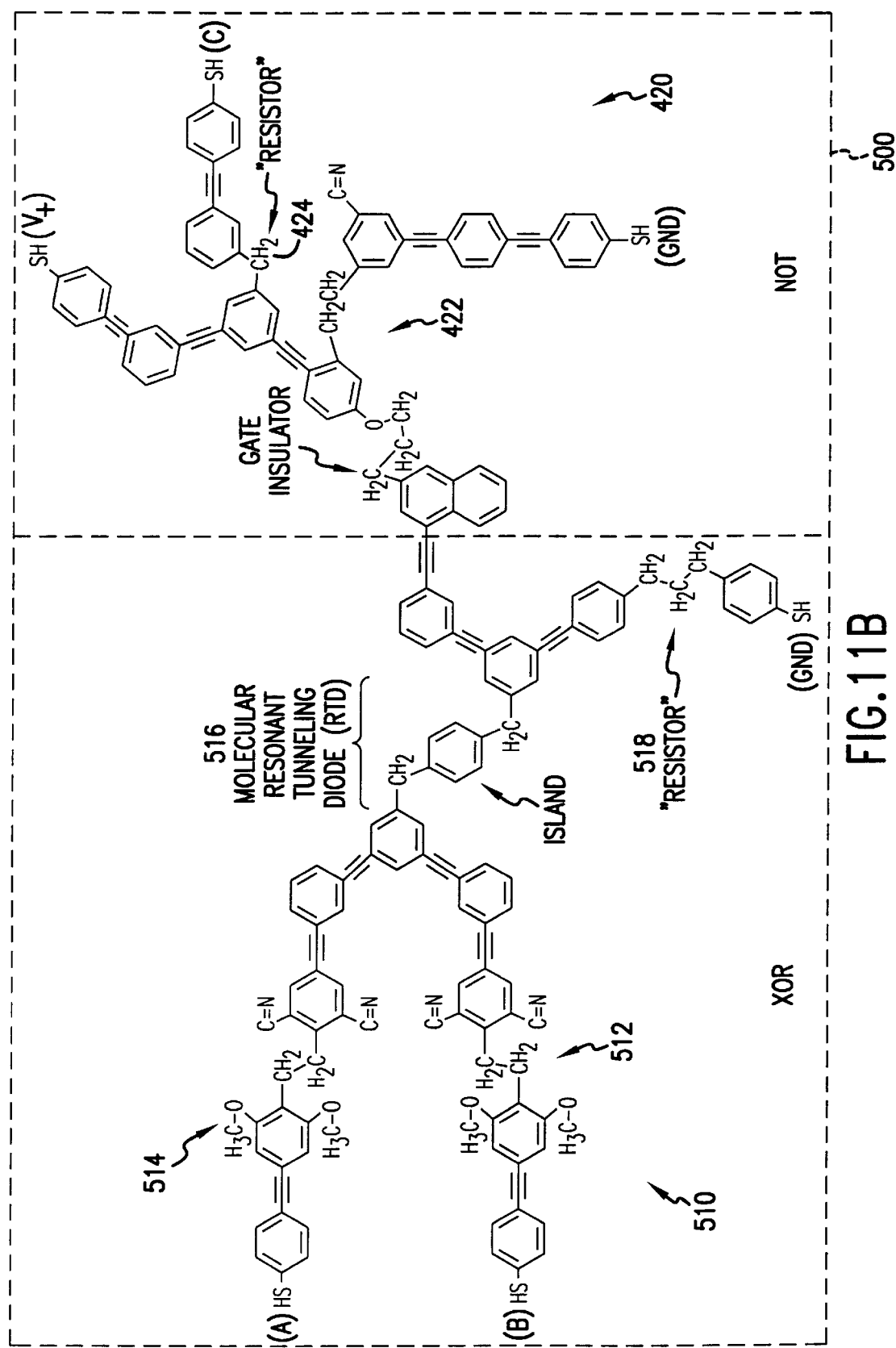

Turning now to FIG. 11B, there is shown an exemplary molecular structure that performs the XNOR function. The XNOR gate 500 is shown to be formed by the molecular XOR gate 510, which logic gate includes the molecular diodes 512 and 514 having their cathode ends joined together through resistances defined by their respective internal resistances. From the node adjoining the two rectifying diodes, there is a molecular resonant tunneling diode 516 coupled on one end thereto and having an opposite end coupled to a molecular conducting wire having an insulator inserted therein to form the resistor 518. That end of the molecular resonant tunneling diode 516 that is coupled to the resistor 518 also is coupled to the molecular NOT gate 420, a molecular structure like the molecular NOT gate in the exemplified NAND gate. As does the NAND gate, the exemplified XNOR gate 500 utilizes a polyphenylene conducting wire with appropriate doping and insulator groups to produce a single molecule that performs the specified Boolean function. In addition to performing a Boolean logic function, the molecule yields power gain, and it therefore has the ability to drive multiple logic circuits from the output C of the XNOR gate.

Figure 12A:
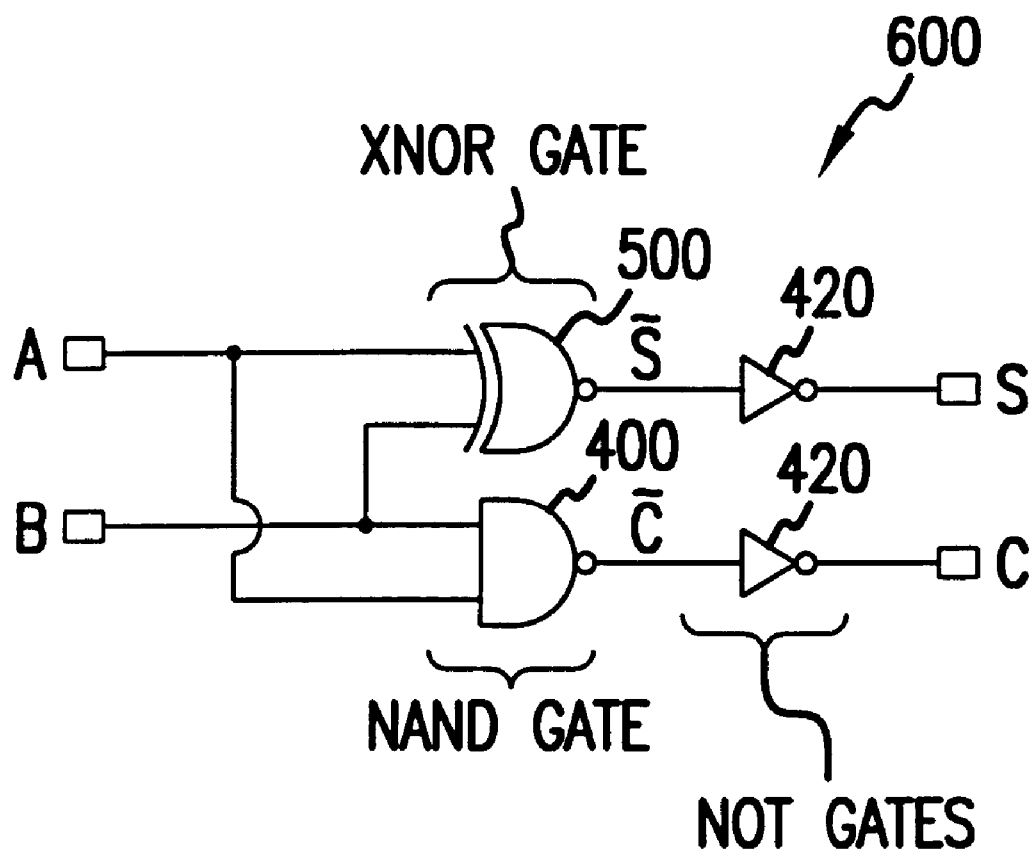

A general schematic circuit diagram representing a HALF ADDER is shown in FIG. 12A. In the HALF ADDER 600, an XNOR gate 500 is combined with an inverter 420 to provide an output S of positive polarity. The XNOR gate 500 is combined with a NAND gate 400, the output of which is coupled to an additional inverter 420. Input signals are provided to the inputs A and B, with the output S being the logical SUM and the output C being the logical CARRY output.

Figure 12B:
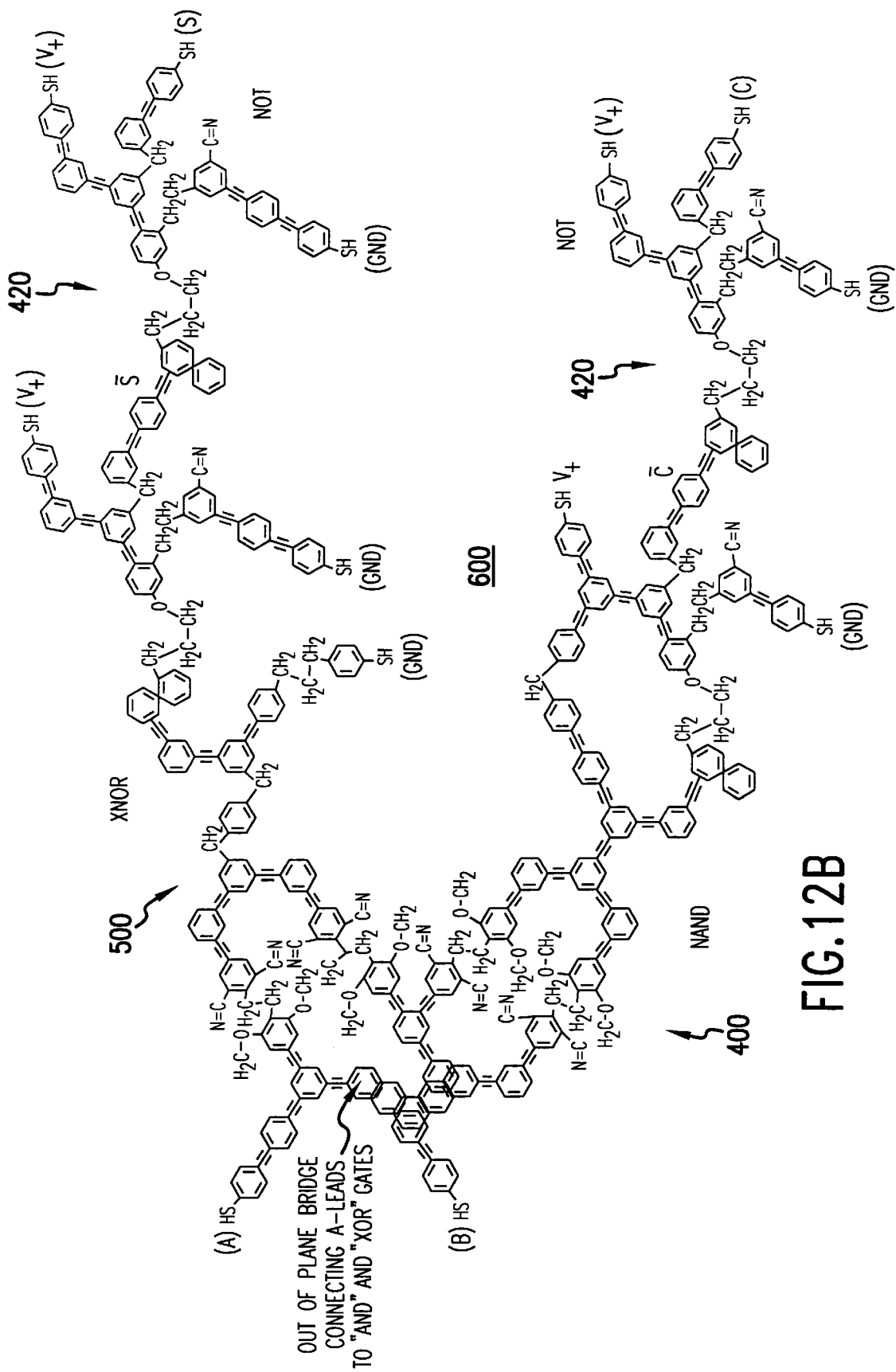

An exemplary molecular structure that performs the HALF ADDER function is shown in FIG. 12B. As shown, the HALF ADDER 600 is formed by a single polyphenylene based molecule. It combines the functions of an XNOR gate 500 with that of a NAND gate 400, by respective combination of the XOR gate 510 with a first inverter (NOT gate) 420 and an AND gate 410 with a second inverter (NOT gate) 420. The output of each of those gates is coupled to respective inverters 420 to provide the desired output polarity. Similarly, more complex Boolean logic functions can be formed by further combination of molecules exhibiting particular functions, to form a still larger single molecule that is capable of performing complex logical functions.

Although this invention has been described in connection with specific forms and embodiments thereof, it will be appreciated that various modifications other than those discussed above may be resorted to without departing form the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is being claimed is:

1. A monomolecular electronic device comprising a plurality of molecular conducting wires chemically joined together with at least one insulating group, at least one of said plurality of molecular conducting wires being chemically joined to a dopant substituent to form an intrinsic bias across said insulating group, a second insulating group being chemically coupled to said at least one molecular conducting wire, and a current conducting complex being chemically joined to said second insulating group to form a single molecule that exhibits power gain, said second insulating group being in sufficient proximity to said dopant substituent to influence said intrinsic bias with a potential applied to said current conducting complex.

2. The monomolecular electronic device as recited in claim 1 further comprising a third insulating group chemically bonded to a second of said plurality of conducting wires and a plurality of joined aromatic ring structures chemically bonded to said third insulating group to form an inverter circuit output.

3. A monomolecular electronic device having power gain, comprising:
  at least one molecular conducting wire having a plurality of joined substantially identical aromatic ring structures;
  at least one first insulating group bonded between a respective pair of said aromatic ring structures to establish two sections of said molecular conducting wire, a first of said sections being coupled to a first electrical contact and a second of said sections being coupled to a second contact;
  means for doping at least one of said first and second sections to respectively form at least one of an electron donor site and an electron acceptor site; and,
  molecular gate means chemically bonded to one of said first and second sections in sufficient proximity to said doping means to influence an intrinsic bias formed between said first and second sections by said doping means with a potential applied to said molecular gate means, said molecular gate means being coupled to a third contact for coupling to a source of said potential.

4. The monomolecular electronic device as recited in claim 3 where said doping means includes at least one group selected from the set consisting of electron donating groups and electron accepting groups chemically bonded to said one of said first and second sections.

5. The monomolecular electronic device as recited in claim 3 where said doping means includes at least one electron donating group chemically bonded to said first section, and at least one electron accepting group chemically bonded to said second section.

6. The monomolecular electronic device as recited in claim 3 where said doping means includes a plurality of groups selected from the set consisting of electron donating groups and electron accepting groups, said plurality of groups being chemically bonded to said at least one of said first and second sections.

7. The monomolecular electronic device as recited in claim 3 where said insulating group is selected from the set consisting of a saturated aliphatic bridging group, or groups having a predominant aliphatic character with respect to electron transport.

8. The monomolecular electronic device as recited in claim 7 where said saturated aliphatic bridging group is selected from the set consisting of a methylene group —$CH_2$—, a sigma-bonded dimethylene group —$CH_2CH_2$—, and longer chains thereof.

9. The monomolecular electronic device as recited in claim 3 where said molecular conducting wire includes a plurality of ethynylene spacers respectively disposed between said aromatic ring structures for linking one aromatic ring structure to an adjacent other.

10. The monomolecular electronic device as recited in claim 3 where said at least one molecular conducting wire is a polyphenylene-based molecular conducting wire.

11. The monomolecular electronic device as recited in claim 3 where said insulating group is selected from a group that creates a potential barrier to electron transport in said at least one molecular conducting wire.

12. The monomolecular electronic device as recited in claim 3 where said molecular gate means includes a second insulating group chemically bonded to said at least one of said first and second sections in proximity to said doping means and a current conducting complex chemically bonded between said second insulating group and said third contact.

13. The monomolecular electronic device as recited in claim 12 where said second insulating group is selected from the set consisting of a saturated aliphatic bridging group, or groups having a predominant aliphatic character with respect to electron transport.

14. The monomolecular electronic device as recited in claim 4 where said gate means includes a second insulating group chemically bonded to one of said first and second sections and a conductive polymer complex chemically bonded between said second insulating group and said third contact.

15. The monomolecular electronic device as recited in claim 14 further comprising a third insulating group chemically bonded to the other of said first and second sections and a plurality of joined aromatic ring structures chemically bonded between said third insulating group and a fourth contact to form a Boolean logic function.

16. The monomolecular electronic device as recited in claim 15 where said Boolean logic function is a NOT function.

17. A monomolecular transistor, comprising:

a polyphenylene-based conducting wire having a plurality of joined molecular ring structures;

at least one insulating group bonded between a respective pair of said molecular ring structures to establish two sections of said conducting wire;

a first dopant group bonded to at least one molecular ring structure of said first section to form a respective electron donor site;

a second dopant group bonded to at least one molecular ring structure of said second section to form an electron acceptor site;

a second insulating group chemically bonded in proximity to eon of said first and second dopant groups; and, a current conducting complex bonded to said second insulating group for coupling an electric charge the reto for modifying an intrinsic bias formed by said first and second dopant groups.

18. A monomolecular transistor having the formula:

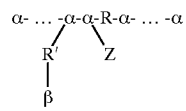

wherein α is a ring of an aromatic group, R is a member of a saturated aliphatic group, R' is a member of a saturated aliphatic group, β is a current conducting complex, Z is at least one dopant substituent.

19. The monomolecular transistor as recited in claim 18 where said at least one dopant substituent is selected from the s et consisting of a member of an electron donor group and a member of an electron acceptor group.

20. A monomolecular transistor having the formula:

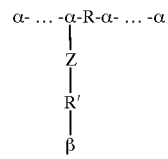

wherein α is a ring of an aromatic group, R is a member of a saturated aliphatic group, R' is a member of a saturated aliphatic group, β is a current conducting complex, Z is at least one dopant subtituent.

21. The monomolecular transistor as recited in claim 20 where said at least one dopant substituent is selected from the set consisting of a member of an electron donor group and a member of an electron acceptor group.

22. A monomolecular logic inverter having the formula:

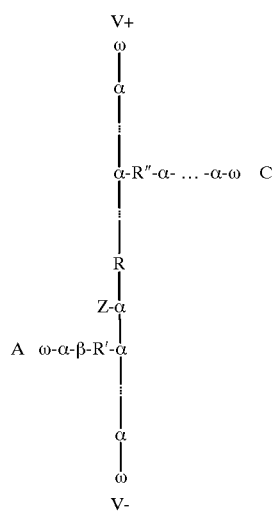

wherein α is a ring of an aromatic group, R, R', and R" are saturated aliphatic groups, Z is at least one dopant substituent, β is a current conducting complex, ω is a substituent that binds chemically to an electrical contact, A designates an input, C designates an output, and V+ and V– are power supply potentials.

23. The monomolecular logic inverter as recited in claim 22 further defined by a molecule of the formula:

24. A monomolecular logic inverter having the formula:

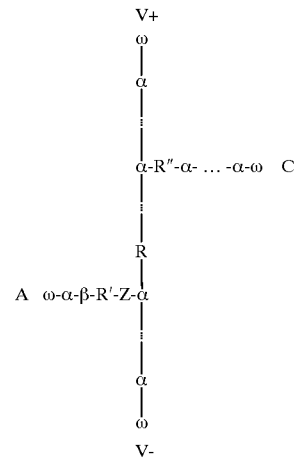

wherein A designates an input, C designates an output, and V+ and V– are power supply potentials.

24. A monomolecular logic inverter having the formula:

wherein α is a ring of an aromatic group, R, R', and R" are saturated aliphatic groups, Z is at least one dopant substituent, β is a conductive polymer complex, ω is a substituent that binds chemically to an electrical contact, A designates an input, C designates an output, and V+ and V– are power supply potentials.

25. The monomolecular logic inverter as recited in claim 24 further defined by a molecule of the formula:

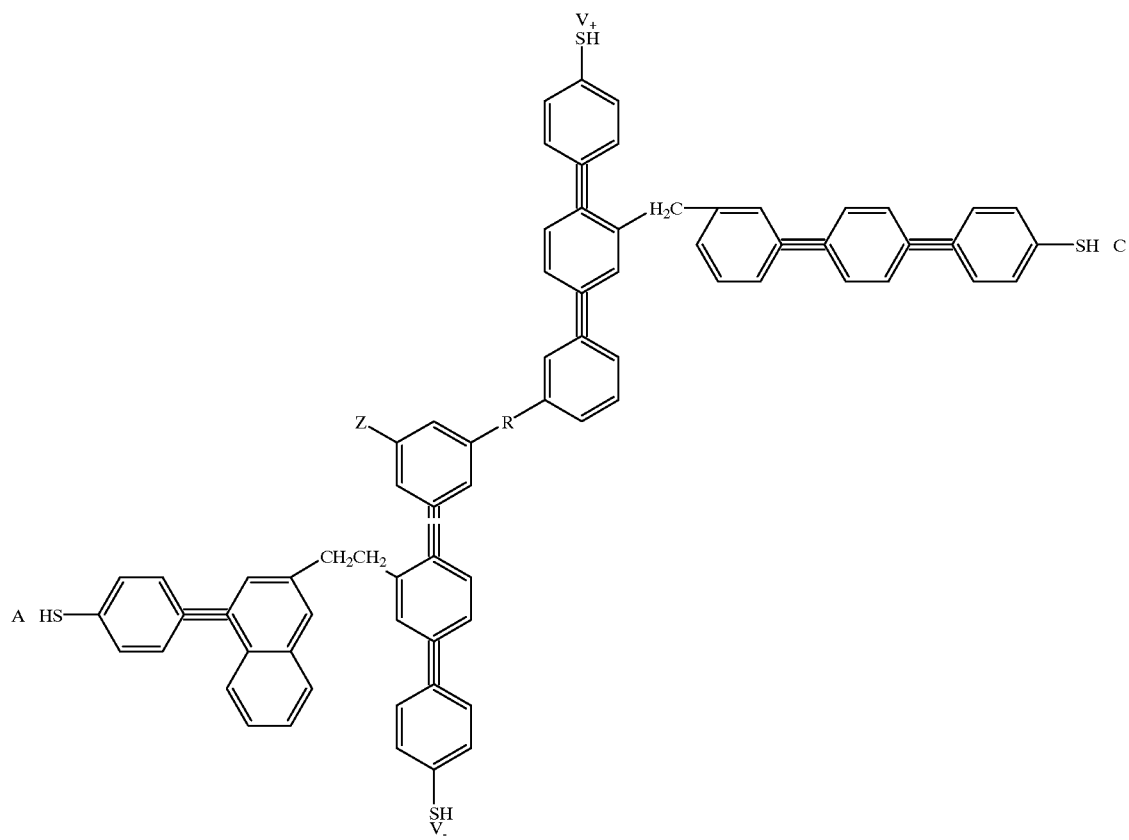

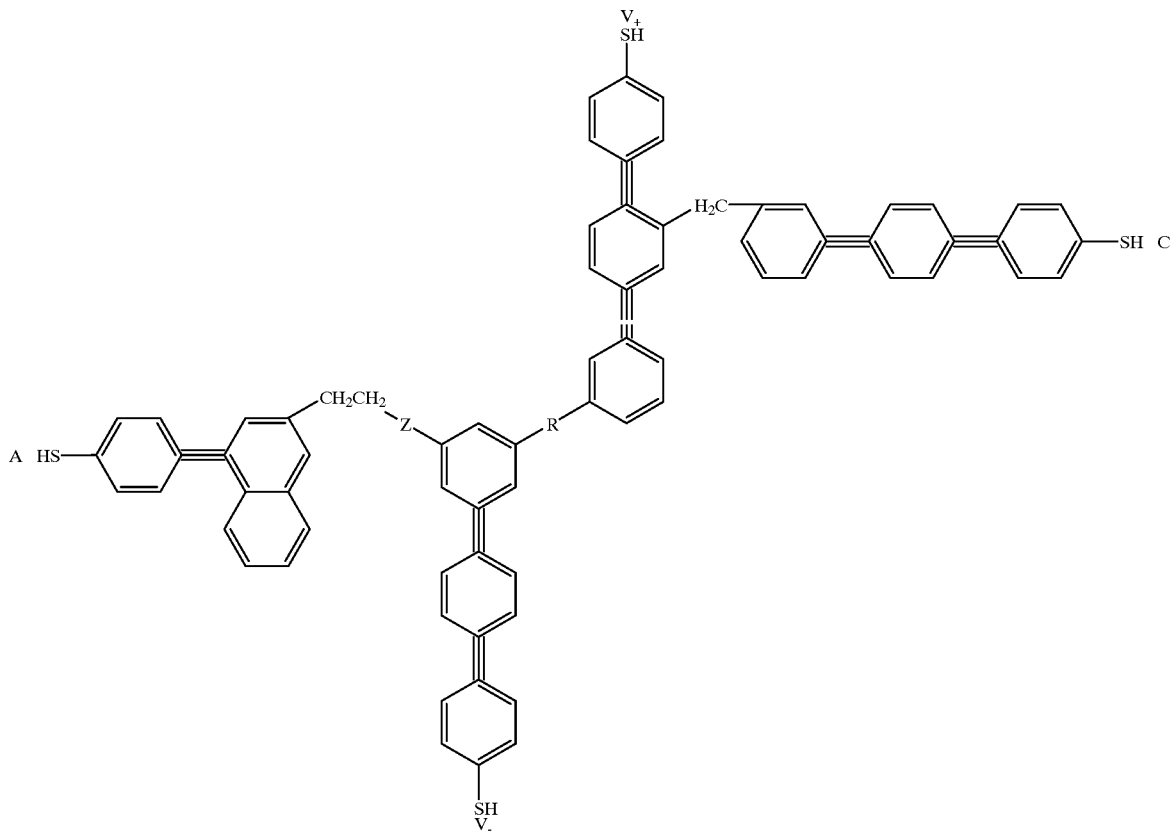

wherein A designates an input, C designates an output, and V+ and V− are power supply potentials.

26. A transistor formed in a single molecule, comprising:
a plurality of conductive polymer chains, each of said polymer chains including a plurality of chemically joined substantially identical aromatic ring structures;
at least one of a first insulating group joined between a respective pair of said plurality of polymer chains;
at least one dopant substituent joined to at least one of said polymer chains to form an intrinsic bias across said first insulating group;
a second insulating group coupled to one of said pair of said plurality of polymer chains in proximity to said at least one dopant substituent; and,
a current conducting complex joined to said second insulating group for conduction of a voltage applied thereto for influencing said intrinsic bias.

27. A monomolecular electronic device comprising:
a plurality of conductive polymer chains, each of said polymer chains including a plurality of chemically joined substantially identical aromatic ring structures;
at least one of a first insulating group joined between a respective pair of said plurality of polymer chains;
at least one dopant substituent joined to at least one of said polymer chains to form an intrinsic bias across said first insulating group;
a second insulating group joined to said at least one dopant substituent;
a current conducting complex joined to said second insulating group to form an input of an inverter circuit;
a third insulating group joined to another of said plurality of polymer chains; and,
a plurality of joined aromatic ring structures chemically bonded to said third insulating group to form an output of said device.

28. A monomolecular transistor having the formula:

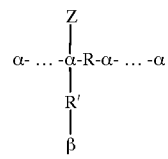

wherein $\alpha$ is a ring of an aromatic group, R is a member of a saturated aliphatic group, R' is a member of a saturated aliphatic group, $\beta$ is a current conducting complex, Z is at least one dopant substituent.

29. A monomolecular transistor having the formula:

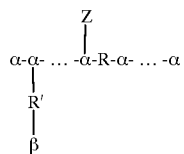

wherein $\alpha$ is a ring of an aromatic group, R is a member of a saturated aliphatic group, R' is a member of a saturated aliphatic group, $\beta$ is a current conducting complex, Z is at least one dopant substituent.

30. A monomolecular transistor, comprising:

a molecular diode having at least one barrier insulating group chemically bonded between a pair of molecular ring structures;

at least one dopant group chemically bonded to one of said pair of molecular ring structures of said molecular diode; and, molecular gate means chemically bonded to said at least one dopant group for influencing an intrinsic bias formed by said at least one dopant group.

31. The monomolecular transistor as recited in claim 30 where an electron donating group is chemically bonded to one of said pair of molecular ring structures of said molecular diode and an electron accepting group is chemically bonded to the other of said pair of molecular ring structures of said molecular diode.

32. The monomolecular transistor as recited in claim 30 where said molecular gate means includes a includes a second insulating group chemically bonded to said at least dopant group, and a conductive polymer complex chemically bonded to said second insulating group.

33. An electronic logic device implementing a NAND gate defined by a molecule having the formula:

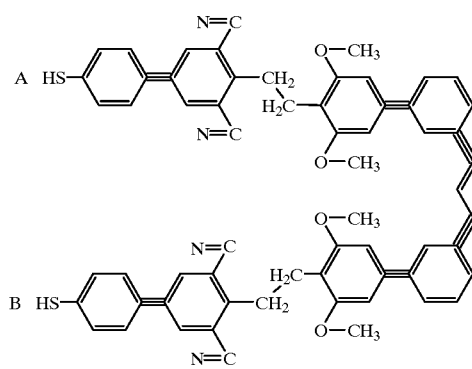
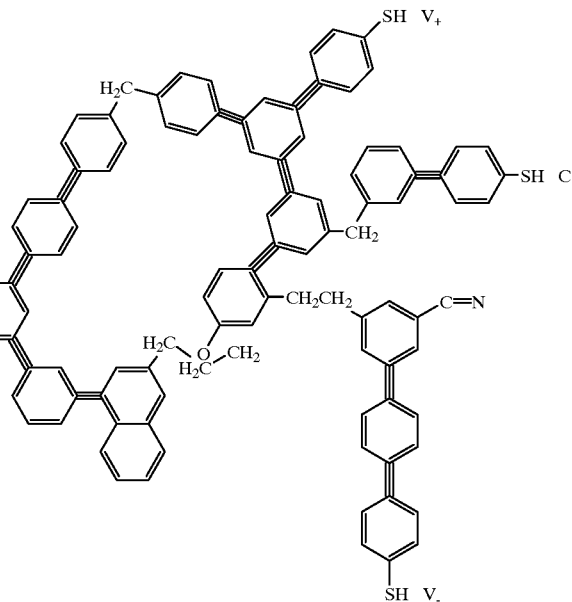

wherein A and B designate respective inputs, C designates an output, and V+ and V− are power supply potentials.

34. An electronic logic device implementing an XNOR gate defined by a molecule having the formula:

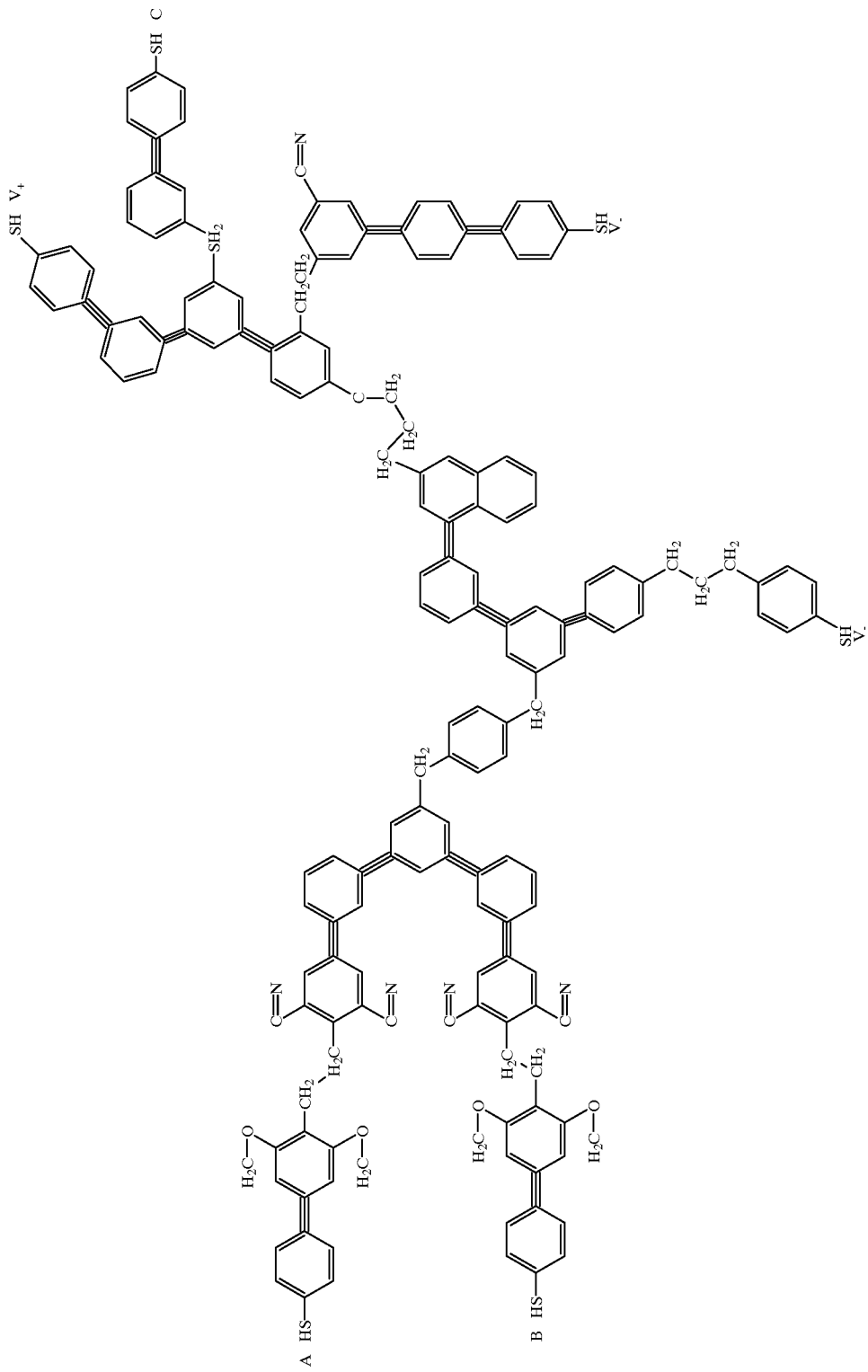

wherein A and B designate respective inputs, C designates an output, and V+ and V− are power supply potentials.

35. An electronic logic device implementing a HALF ADDER defined by a molecule having the formula:

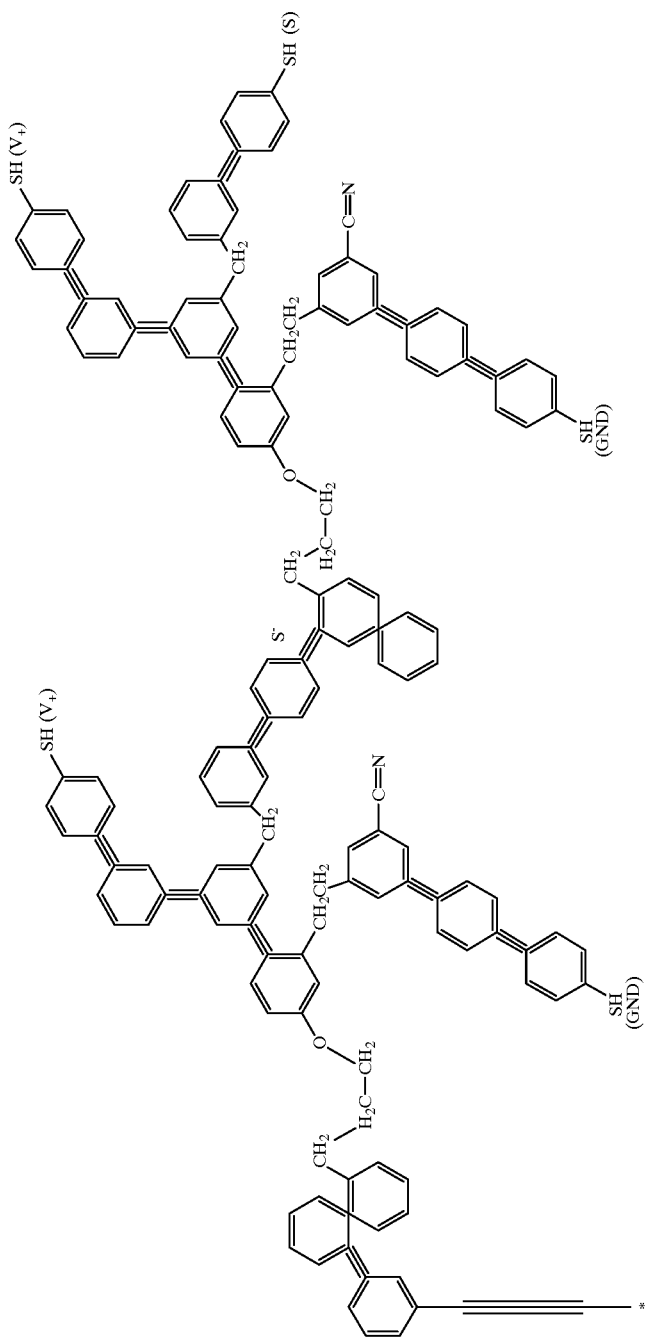

-continued
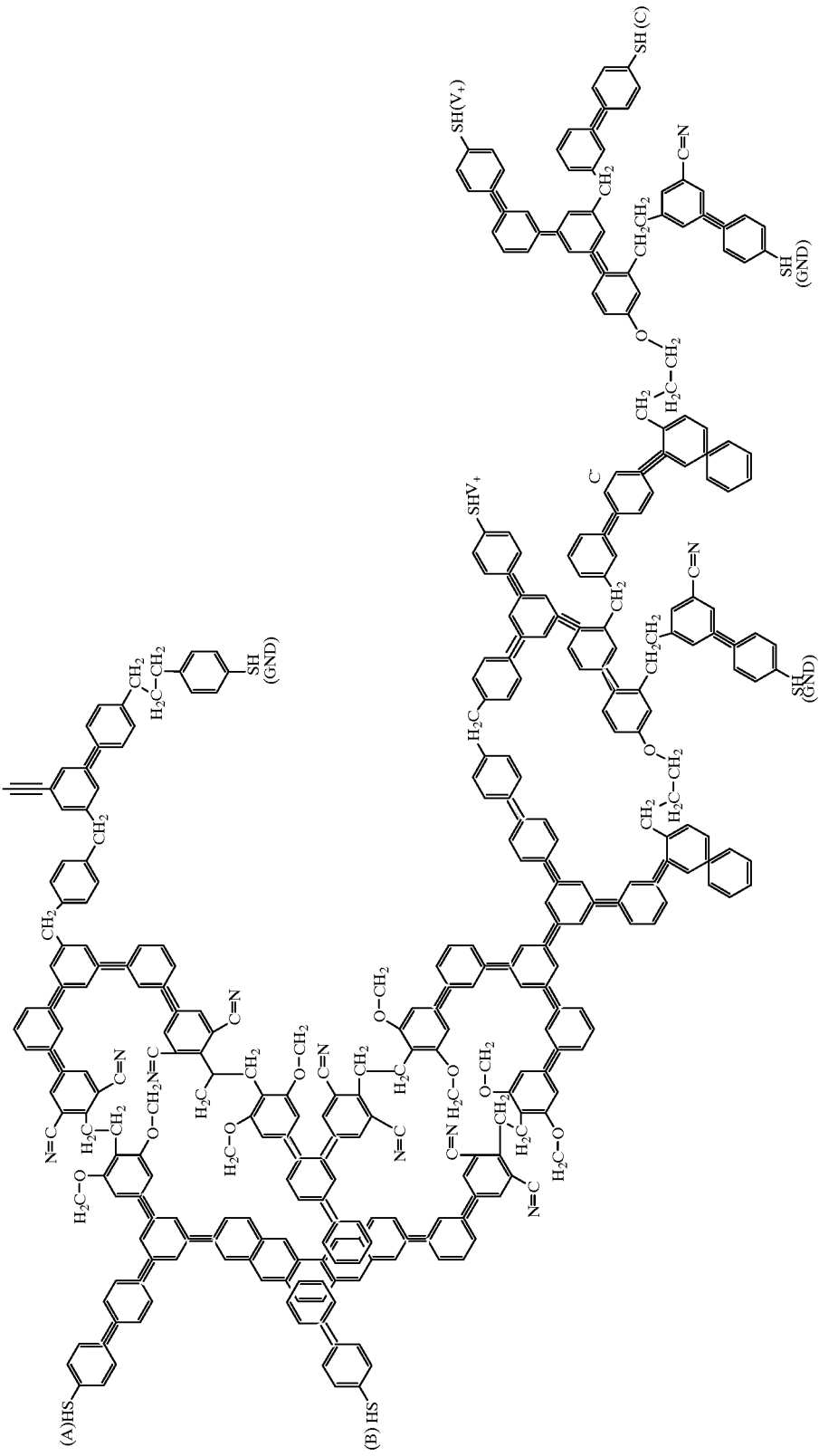

wherein A and B designate respective inputs, S designates a SUM output, C designates a CARRY output, and V+ and V− are power supply potentials.

36. A monomolecular electronic device, comprising:

a molecular diode having at least one barrier insulating group chemically bonded between a pair of molecular ring structures to form a pair of diode sections;

at least one dopant group chemically bonded to one of said pair of said diode sections; and, molecular gate means chemically bonded to said one diode section for influencing an intrinsic bias formed by said at least one dopant group.

* * * * *

UNITED STATES PATENT AND TRADEMARK OFFICE
CERTIFICATE OF CORRECTION

PATENT NO. : 6,339,227 B1
DATED : January 15, 2002
INVENTOR(S) : James C. Ellenbogen It is certified that error appears in the above-identified patent and that said Letters Patent is hereby corrected as shown below:

Columns 21 and 22,
Replace Claim 23 with:
23. The monomolecular logic inverter as recited in Claim 22 further defined by a molecule of the formula:

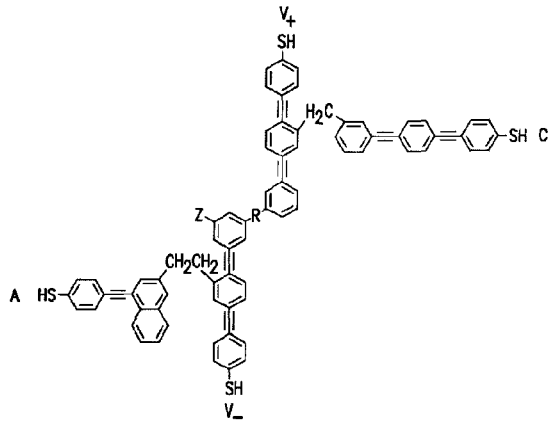

wherein A designates an input, C designates an output, and V+ and V− are power supply potentials.

Columns 23 and 24,
Replace Claim 25 with:
25. The monomolecular logic inverter as recited in claim 24 further defined by a molecule of the formula:

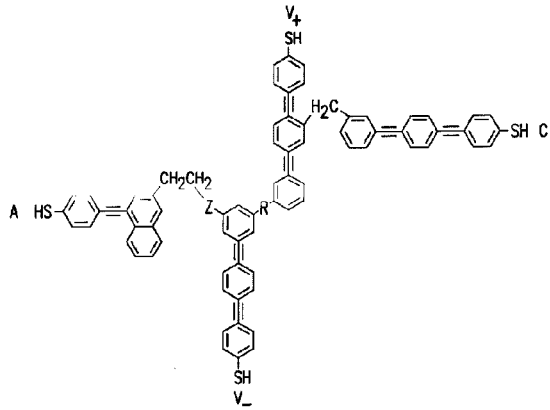

wherein A designates an input, C designates and output, and V+ and V− are power supply potentials.

UNITED STATES PATENT AND TRADEMARK OFFICE
CERTIFICATE OF CORRECTION

PATENT NO. : 6,339,227 B1  Page 2 of 3
DATED : January 15, 2002
INVENTOR(S) : James C. Ellenbogen It is certified that error appears in the above-identified patent and that said Letters Patent is hereby corrected as shown below:

Columns 25 and 26,
Replace Claim 33 with:
33. An electronic logic device implementing a NAND gate defined by a molecule having the formula:

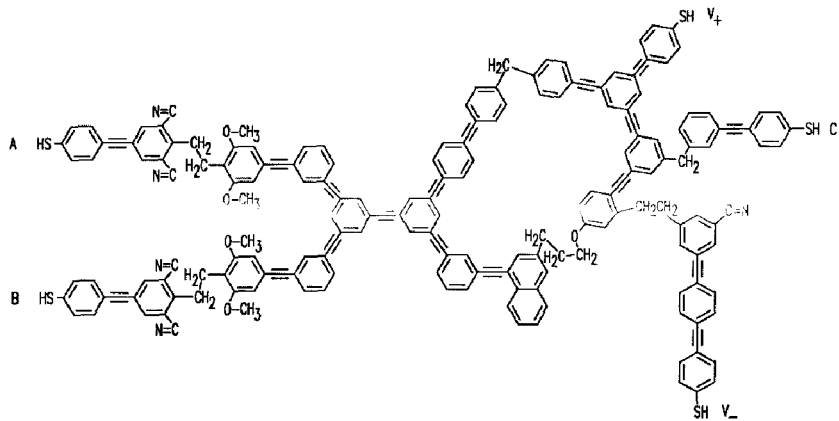

wherein A and B designate respective inouts, C designates an output, and V+ and V− are power supply potentials.

Replace Claim 34 with:
34. An electronic logic device implementing an XNOR gate defined by a molecule having the formula:

wherein A and B designate respective inputs, C designates an output, and V+ and V− are power supply potentials.

UNITED STATES PATENT AND TRADEMARK OFFICE
CERTIFICATE OF CORRECTION

PATENT NO. : 6,339,227 B1  Page 3 of 3
DATED : January 15, 2002
INVENTOR(S) : James C. Ellenbogen It is certified that error appears in the above-identified patent and that said Letters Patent is hereby corrected as shown below:

Columns 27 ans 28,
Replace Claim 35 with:
35. An electronic logic device implementing a HALF ADDER defined by a molecule having the formula:

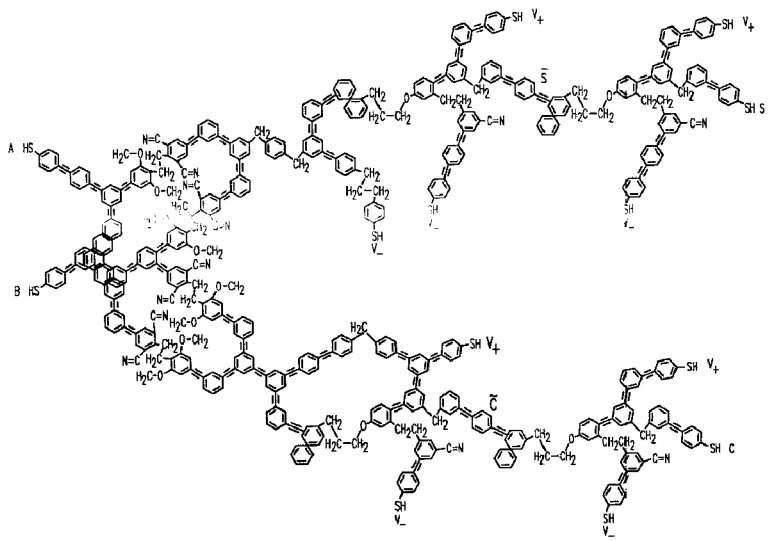

wherein A and B designate respective inputs, S designates a SUM output, C designates a CARRY output, and V+ and V− are power supply potentials.

Signed and Sealed this

Fourteenth Day of December, 2004

JON W. DUDAS
Director of the United States Patent and Trademark Office